United States Patent
Lin et al.

(10) Patent No.: US 8,796,846 B2
(45) Date of Patent: Aug. 5, 2014

(54) SEMICONDUCTOR DEVICE WITH A VERTICAL INTERCONNECT STRUCTURE FOR 3-D FO-WLCSP

(75) Inventors: Yaojian Lin, Singapore (SG); Xusheng Bao, Singapore (SG); Kang Chen, Singapore (SG); Jianmin Fang, Singapore (SG)

(73) Assignee: STATS ChipPAC, Ltd., Singapore (SG)

( * ) Notice: Subject to any disclaimer, the term of this patent is extended or adjusted under 35 U.S.C. 154(b) by 889 days.

(21) Appl. No.: 12/572,590

(22) Filed: Oct. 2, 2009

(65) Prior Publication Data
US 2010/0148360 A1 Jun. 17, 2010

Related U.S. Application Data

(62) Division of application No. 12/333,977, filed on Dec. 12, 2008, now Pat. No. 7,642,128.

(51) Int. Cl.
*H01L 27/00* (2006.01)

(52) U.S. Cl.
USPC .......................................... 257/737; 257/686

(58) Field of Classification Search
USPC ................................................ 257/737, 686
See application file for complete search history.

(56) References Cited

U.S. PATENT DOCUMENTS

| | | | |
|---|---|---|---|
| 5,250,843 A | 10/1993 | Eichelberger | |
| 5,353,498 A | 10/1994 | Fillion et al. | |
| 5,841,193 A | 11/1998 | Eichelberger | |
| 5,987,744 A * | 11/1999 | Lan et al. | 29/852 |
| 6,750,547 B2 | 6/2004 | Jeung et al. | |
| 6,998,344 B2 | 2/2006 | Akram et al. | |
| 7,545,047 B2 | 6/2009 | Bauer et al. | |
| 7,619,901 B2 | 11/2009 | Eichelberger et al. | |
| 7,737,565 B2 | 6/2010 | Coffy | |
| 7,777,351 B1 | 8/2010 | Berry et al. | |
| 7,816,183 B2 | 10/2010 | Kawata | |
| 7,834,462 B2 | 11/2010 | Dobritz et al. | |
| 7,851,259 B2 | 12/2010 | Kim | |
| 2004/0145044 A1 * | 7/2004 | Sugaya et al. | 257/698 |
| 2005/0236709 A1 * | 10/2005 | Eng et al. | 257/737 |
| 2008/0111233 A1 * | 5/2008 | Pendse | 257/712 |
| 2008/0169546 A1 | 7/2008 | Kwon et al. | |

(Continued)

FOREIGN PATENT DOCUMENTS

KR 20100009941 A 1/2010

*Primary Examiner* — Howard Weiss
*Assistant Examiner* — Tifney Skyles
(74) *Attorney, Agent, or Firm* — Robert D. Atkins; Atkins & Associates, P.C.

(57) ABSTRACT

A semiconductor device is made by forming a first conductive layer over a carrier. The first conductive layer has a first area electrically isolated from a second area of the first conductive layer. A conductive pillar is formed over the first area of the first conductive layer. A semiconductor die or component is mounted to the second area of the first conductive layer. A first encapsulant is deposited over the semiconductor die and around the conductive pillar. A first interconnect structure is formed over the first encapsulant. The first interconnect structure is electrically connected to the conductive pillar. The carrier is removed. A portion of the first conductive layer is removed. The remaining portion of the first conductive layer includes an interconnect line and UBM pad. A second interconnect structure is formed over a remaining portion of the first conductive layer is removed.

32 Claims, 13 Drawing Sheets

(56) References Cited

U.S. PATENT DOCUMENTS

| | | |
|---|---|---|
| 2008/0258289 A1 | 10/2008 | Pendse et al. |
| 2008/0284045 A1 | 11/2008 | Gerber et al. |
| 2008/0315385 A1 | 12/2008 | Gerber et al. |
| 2009/0236686 A1 | 9/2009 | Shim et al. |
| 2010/0171205 A1 | 7/2010 | Chen et al. |
| 2010/0171207 A1 | 7/2010 | Shen et al. |
| 2010/0224974 A1 | 9/2010 | Shim et al. |
| 2010/0317153 A1 | 12/2010 | Do et al. |

* cited by examiner

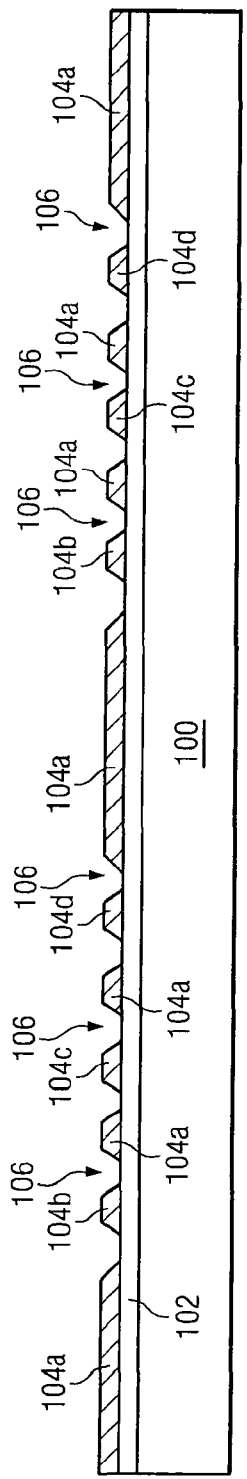
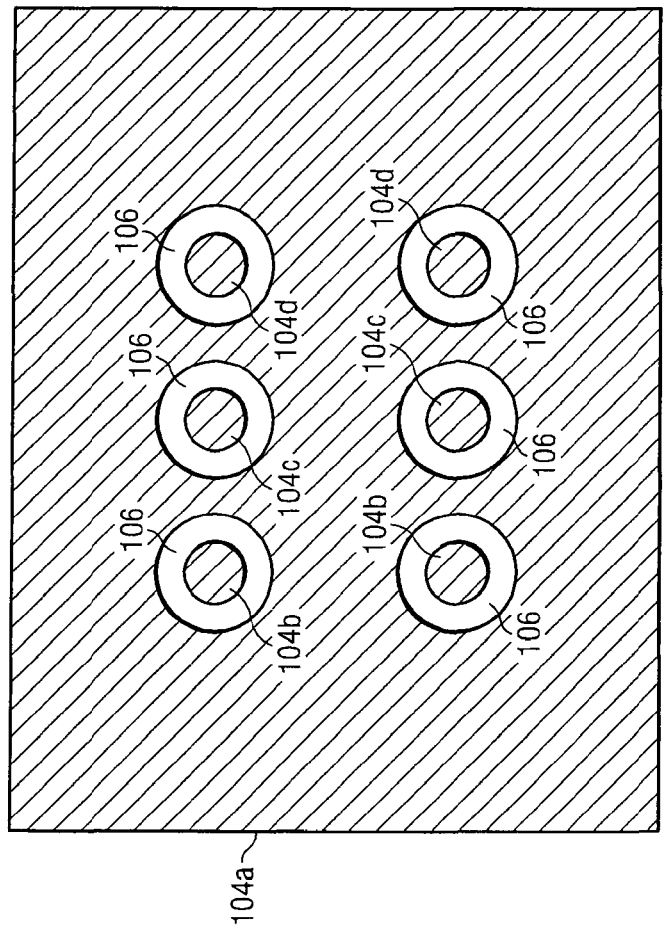
FIG. 3a
FIG. 3b

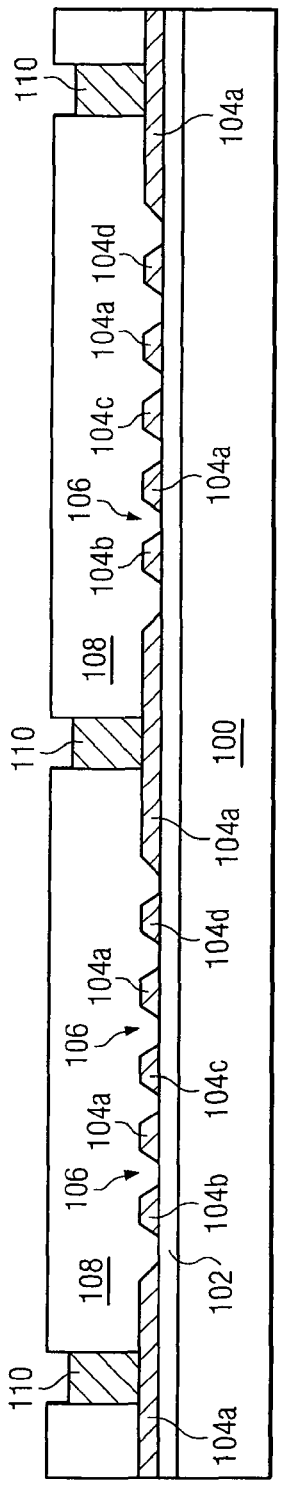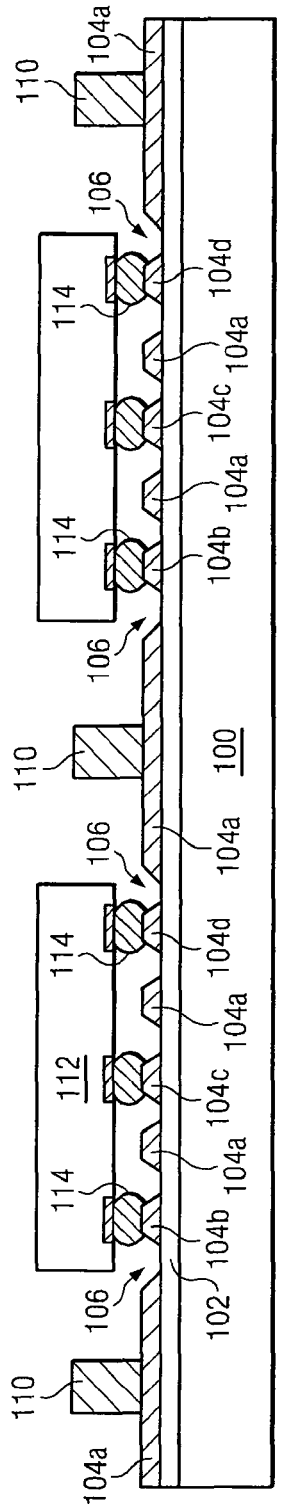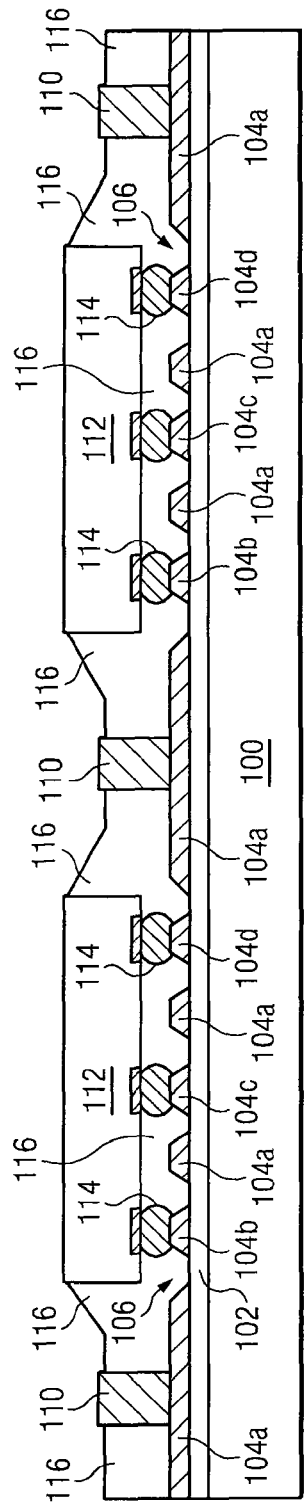

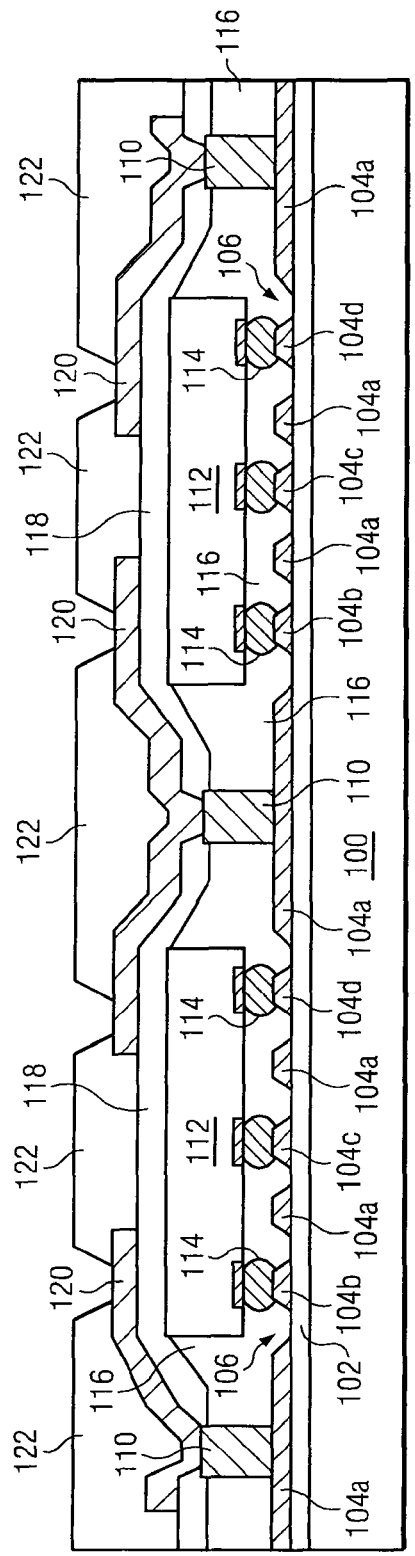
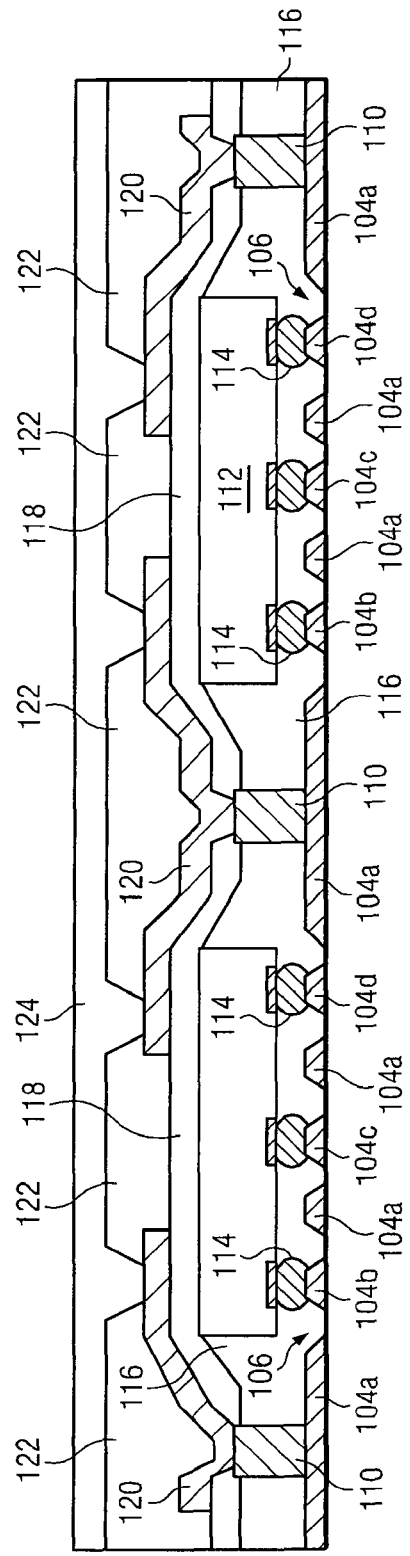
FIG. 3f
FIG. 3g

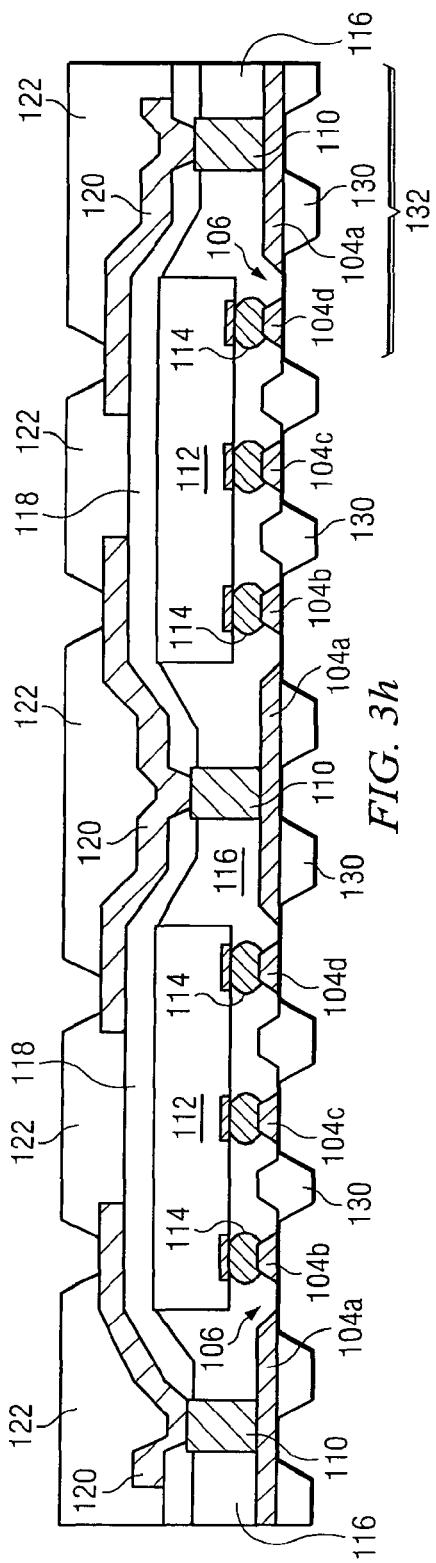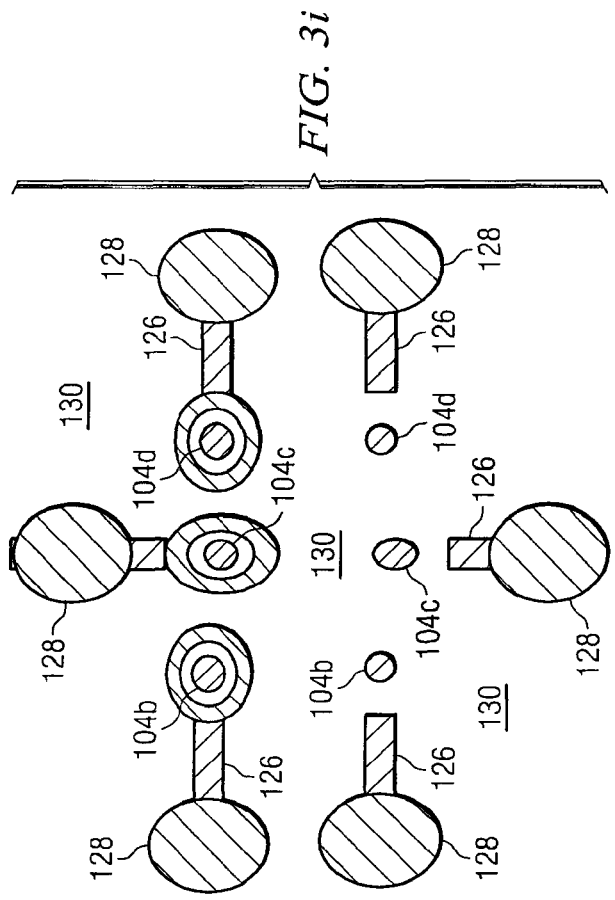

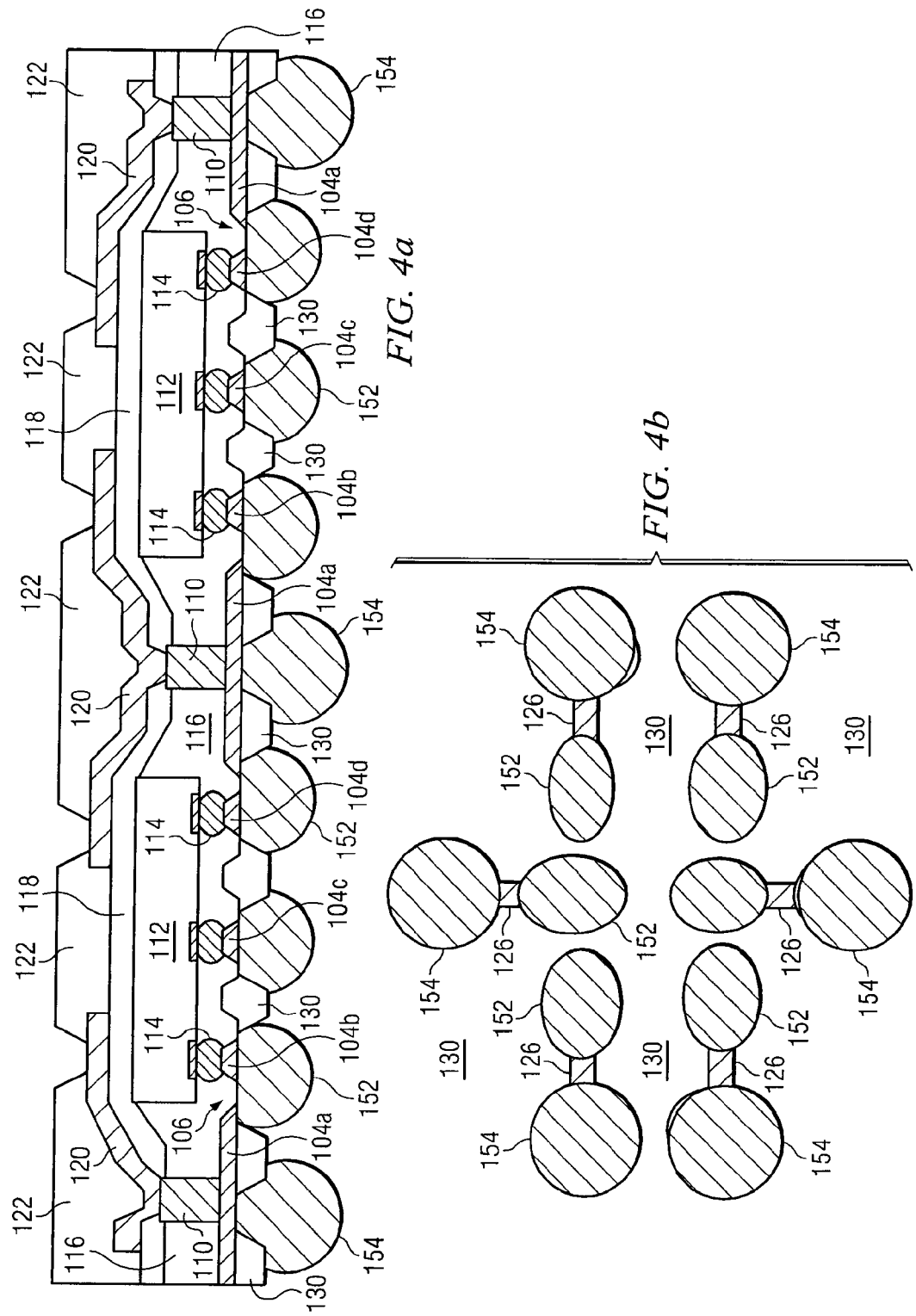

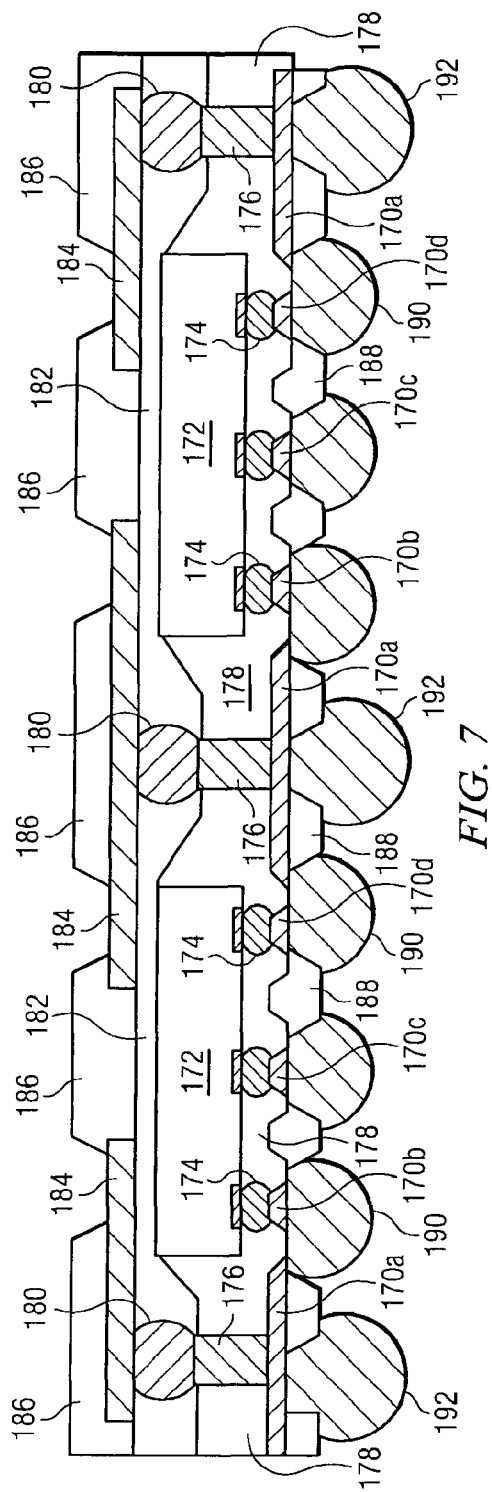
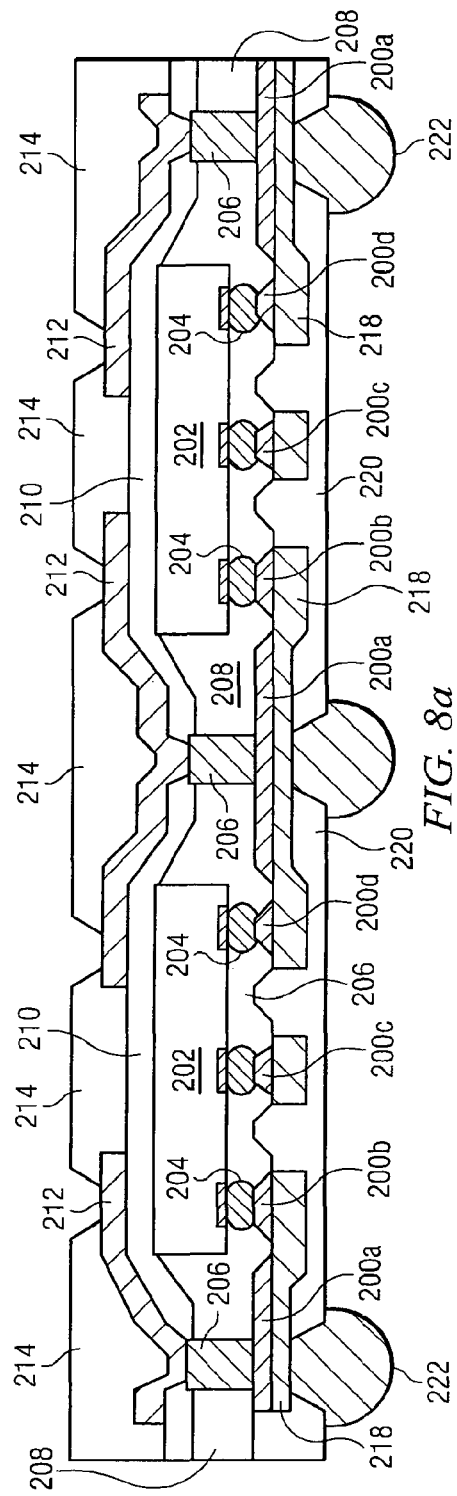
FIG. 7
FIG. 8a

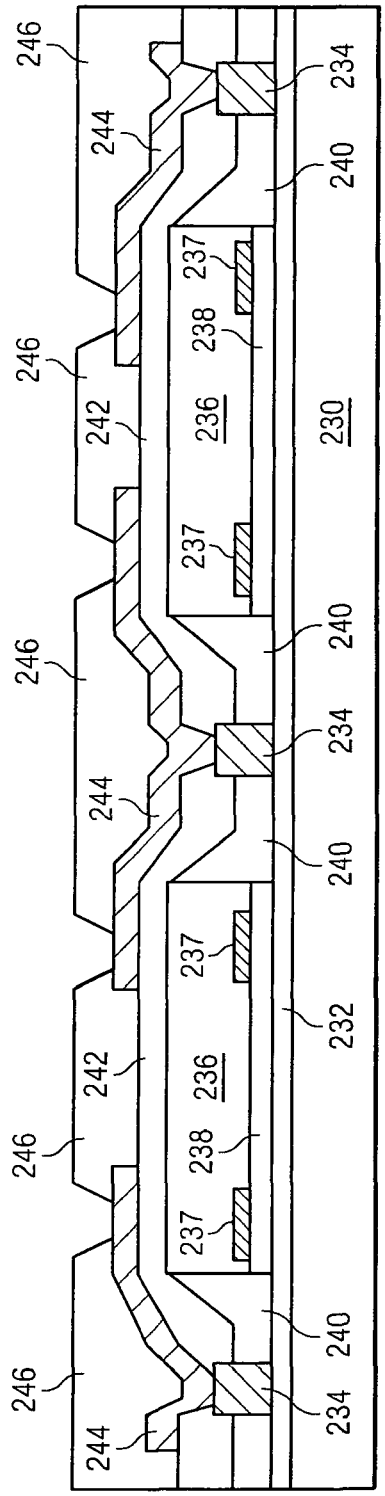
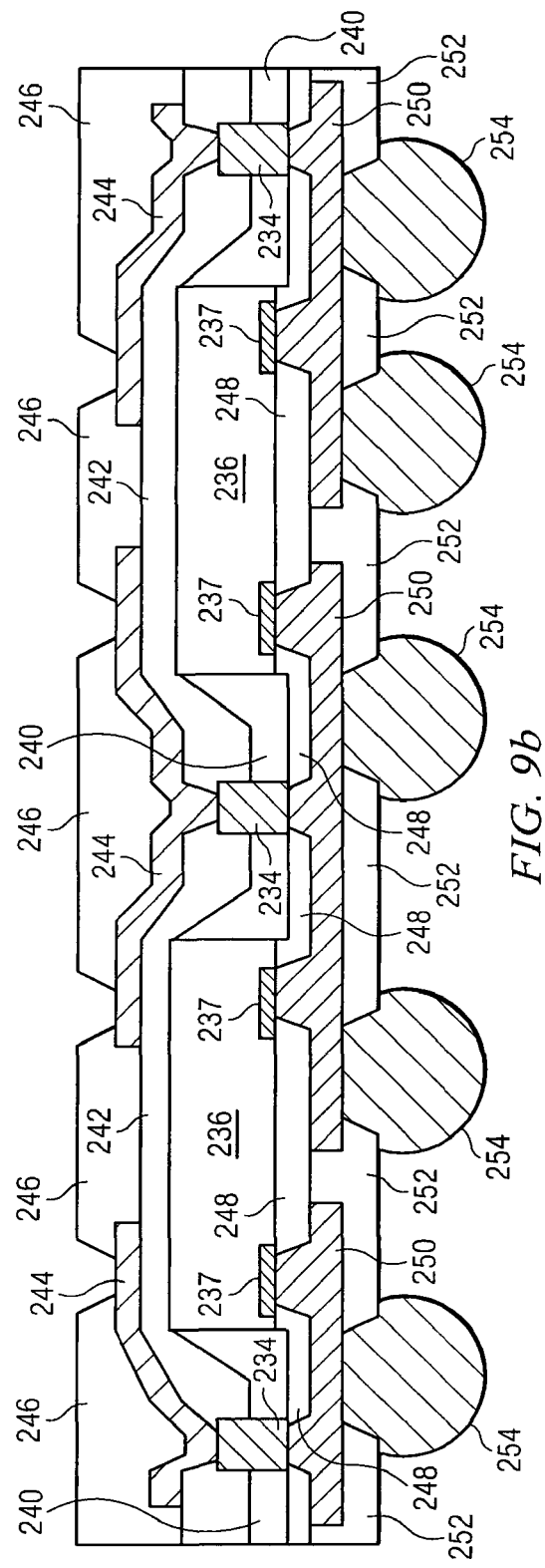
FIG. 9a
FIG. 9b

US 8,796,846 B2

SEMICONDUCTOR DEVICE WITH A VERTICAL INTERCONNECT STRUCTURE FOR 3-D FO-WLCSP

CLAIM TO DOMESTIC PRIORITY

The present application is a division of U.S. patent application Ser. No. 12/333,977, now U.S. Pat. No. 7,642,128, filed Dec. 12, 2008, and claims priority to the foregoing parent application pursuant to 35 U.S.C. §121.

FIELD OF THE INVENTION

The present invention relates in general to semiconductor devices and, more particularly, to a semiconductor device having a vertical interconnect structure for three-dimensional (3-D) fan-out wafer level chip scale packages.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as high-speed calculations, transmitting and receiving electromagnetic signals, controlling electronic devices, transforming sunlight to electricity, and creating visual projections for television displays. Semiconductor devices are found in the fields of entertainment, communications, power generation, networks, computers, and consumer products. Semiconductor devices are also found in electronic products including military, aviation, automotive, industrial controllers, and office equipment.

Semiconductor devices exploit the electrical properties of semiconductor materials. The atomic structure of semiconductor material allows its electrical conductivity to be manipulated by the application of an electric field or through the process of doping. Doping introduces impurities into the semiconductor material to manipulate and control the conductivity of the semiconductor device.

A semiconductor device contains active and passive electrical structures. Active structures, including transistors, control the flow of electrical current. By varying levels of doping and application of an electric field, the transistor either promotes or restricts the flow of electrical current. Passive structures, including resistors, diodes, and inductors, create a relationship between voltage and current necessary to perform a variety of electrical functions. The passive and active structures are electrically connected to form logic circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

The electrical interconnection between a fan-out wafer level chip scale package (FO-WLCSP) containing semiconductor devices on multiple levels (3-D device integration) and external devices can be accomplished with conductive through silicon vias (TSV) or through hole vias (THV). In most TSVs and THVs, the sidewalls and bottom-side of the via are conformally plated with conductive materials to enhance adhesion. The TSVs and THVs are then filled with another conductive material, for example, by copper deposition through an electroplating process. The TSV and THV formation typically involves considerable time for the via filling, which reduces the unit-per-hour (UPH) production schedule. The equipment need for electroplating, e.g., plating bath, and sidewall passivation increases manufacturing cost. In addition, voids may be formed within the vias, which causes defects and reduces reliability of the device. TSV and THV can be a slow and costly approach to make vertical electrical interconnections in semiconductor packages. These interconnect schemes also have problems with die placement accuracy, warpage control before and after removal of the carrier, and process cost management.

SUMMARY OF THE INVENTION

A need exists to provide an interconnect structure for 3-D semiconductor devices. Accordingly, in one embodiment, the present invention is a semiconductor device comprising a first conductive layer having a first area electrically isolated from a second area of the first conductive layer. A conductive pillar is formed over the first area of the first conductive layer. A semiconductor die or component is mounted to the second area of the first conductive layer. An encapsulant is deposited over the semiconductor die and around the conductive pillar. A first interconnect structure is formed over the encapsulant, the first interconnect structure being electrically connected to the conductive pillar. A second interconnect structure is formed over a portion of the first conductive layer.

In another embodiment, the present invention is a semiconductor device comprising a first conductive layer having a first area electrically isolated from a second area of the first conductive layer. A conductive pillar is formed over the first area of the first conductive layer. A semiconductor die or component is mounted to the second area of the first conductive layer. A first encapsulant is deposited over the semiconductor die and around the conductive pillar. A first interconnect structure is formed over the first encapsulant, the first interconnect structure being electrically connected to the conductive pillar.

In another embodiment, the present invention is a semiconductor device comprising a conductive pillar and semiconductor die or component disposed adjacent to the conductive pillar. A first encapsulant is deposited over the semiconductor die and around the conductive pillar. A first interconnect structure is forming over the first encapsulant. The first interconnect structure is electrically connected to the conductive pillar.

In another embodiment, the present invention is a semiconductor device comprising a first conductive layer including an interconnect line and under bump metallization pad. A conductive pillar is formed over the first conductive layer. A semiconductor die or component is mounted to the first conductive layer. A first encapsulant is deposited over the semiconductor die and around the conductive pillar. A first interconnect structure is formed over the first encapsulant. The first interconnect structure is electrically connected to the conductive pillar. A second interconnect structure is formed over the first conductive layer.

BRIEF DESCRIPTION OF THE DRAWINGS

FIGS. 3a-3k illustrate a process of forming a vertical interconnect structure for FO-WLCSP;

FIGS. 4a-4b illustrate the FO-WLCSP with vertical interconnect structure having conductive pillars;

FIG. 7 illustrates an alternate embodiment of the FO-WLCSP with vertical interconnect structure having conductive pillars and solder bumps;

FIGS. 8a-8c illustrate the FO-WLCSP with vertical interconnect structure having RDL under the conductive pillars;

FIGS. 9a-9b illustrate another process of forming a vertical interconnect structure for 3-D WLCSP;

DETAILED DESCRIPTION OF THE DRAWINGS

Figure 1:
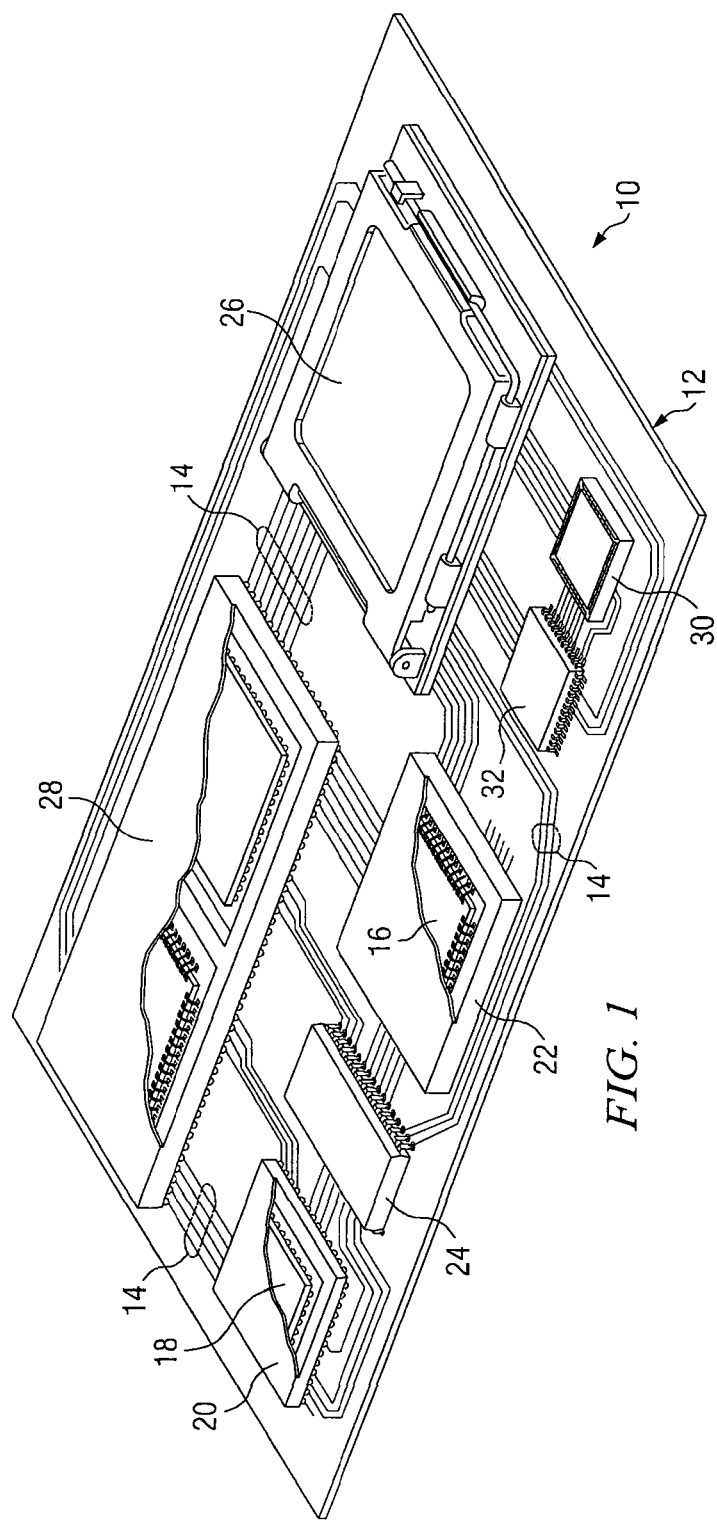
FIG. 1 illustrates a printed circuit board (PCB) with different types of packages mounted to its surface.

The present invention is described in one or more embodiments in the following description with reference to the Figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors, have the ability to control the flow of electrical current. Passive electrical components, such as capacitors, inductors, resistors, and transformers, create a relationship between voltage and current necessary to perform electrical circuit functions.

Passive and active components are formed on the surface of the semiconductor wafer by a series of process steps including doping, deposition, photolithography, etching, and planarization. Doping introduces impurities into the semiconductor material by techniques such as ion implantation, or thermal diffusion. The doping process modifies the electrical conductivity of semiconductor material in active devices, transforming the semiconductor material into a permanent insulator, permanent conductor, or changing the way the semiconductor material changes in conductivity in response to an electric field. Transistors contain regions of varying types and degrees of doping arranged as necessary to enable the transistor to promote or restrict the flow of electrical current upon the application of an electric field.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting device or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 10 having a chip carrier substrate or printed circuit board (PCB) 12 with a plurality of semiconductor packages mounted on its surface. Electronic device 10 may have one type of semiconductor package, or multiple types of semiconductor packages, depending on the application. The different types of semiconductor packages are shown in FIG. 1 for purposes of illustration.

Electronic device 10 may be a stand-alone system that uses the semiconductor packages to perform an electrical function. Alternatively, electronic device 10 may be a subcomponent of a larger system. For example, electronic device 10 may be a graphics card, network interface card, or other signal processing card that can be inserted into a computer. The semiconductor package can include microprocessors, memories, application specific integrated circuits (ASICs), logic circuits, analog circuits, RF circuits, discrete devices, or other semiconductor die or electrical components.

In FIG. 1, PCB 12 provides a general substrate for structural support and electrical interconnect of the semiconductor packages mounted on the PCB. Conductive signal traces 14 are formed on a surface or within layers of PCB 12 using evaporation, electrolytic plating, electroless plating, screen printing, PVD, or other suitable metal deposition process. Signal traces 14 provide for electrical communication between each of the semiconductor packages, mounted components, and other external system components. Traces 14 also provide power and ground connections to each of the semiconductor packages.

In some embodiments, a semiconductor device has two packaging levels. First level packaging is a technique for mechanically and electrically attaching the semiconductor die to a carrier. Second level packaging involves mechanically and electrically attaching the carrier to the PCB. In other embodiments, a semiconductor device may only have the first level packaging where the die is mechanically and electrically mounted directly to the PCB.

For the purpose of illustration, several types of first level packaging, including wire bond package 16 and flip chip 18, are shown on PCB 12. Additionally, several types of second level packaging, including ball grid array (BGA) 20, bump chip carrier (BCC) 22, dual in-line package (DIP) 24, land grid array (LGA) 26, multi-chip module (MCM) 28, quad flat non-leaded package (QFN) 30, and quad flat package 32, are shown mounted on PCB 12. Depending upon the system requirements, any combination of semiconductor packages, configured with any combination of first and second level packaging styles, as well as other electronic components, can be connected to PCB 12. In some embodiments, electronic device 10 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a shorter manufacturing process. The resulting devices are less likely to fail and less expensive to manufacture resulting in lower costs for consumers.

Figure 2A:
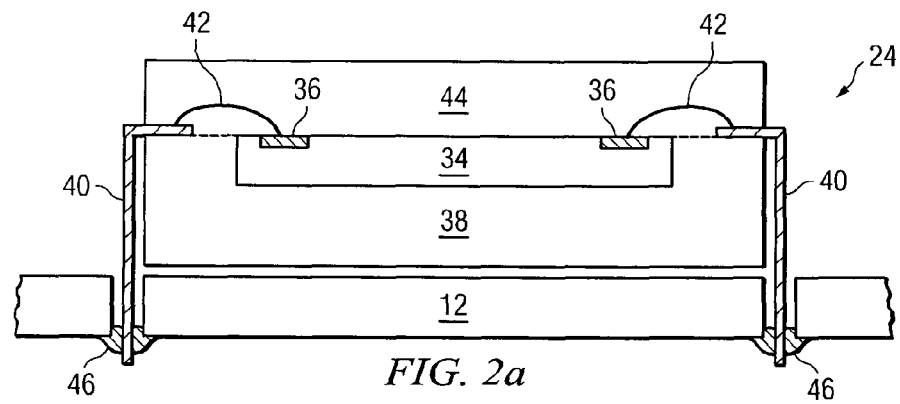
FIGS. 2a-2c illustrate further detail of the representative semiconductor packages mounted to the PCB.

FIG. 2a illustrates further detail of DIP 24 mounted on PCB 12. DIP 24 includes semiconductor die 34 having contact pads 36. Semiconductor die 34 includes an active region containing analog or digital circuits implemented as active devices, passive devices, conductive layers, and dielectric layers formed within semiconductor die 34 and are electrically interconnected according to the electrical design of the die. For example, the circuit may include one or more transistors, diodes, inductors, capacitors, resistors, and other circuit elements formed within the active region of die 34. Contact pads 36 are made with a conductive material, such as aluminum (Al), copper (Cu), tin (Sn), nickel (Ni), gold (Au), or silver (Ag), and are electrically connected to the circuit elements formed within die 34. Contact pads 36 are formed by PVD, CVD, electrolytic plating, or electroless plating process. During assembly of DIP 24, semiconductor die 34 is mounted to a carrier 38 using a gold-silicon eutectic layer or adhesive material such as thermal epoxy. The package body includes an insulative packaging material such as polymer or ceramic. Conductor leads 40 are connected to carrier 38 and wire bonds 42 are formed between leads 40 and contact pads 36 of die 34 as a first level packaging. Encapsulant 44 is deposited over the package for environmental protection by preventing moisture and particles from entering the package and contaminating die 34, contact pads 36, or wire bonds 42. DIP 24 is connected to PCB 12 by inserting leads 40 into holes formed through PCB 12. Solder material 46 is flowed around leads 40 and into the holes to physically and electrically connect DIP 24 to PCB 12. Solder material 46 can be any metal or electrically conductive material, e.g., Sn, lead (Pb), Au, Ag, Cu, zinc (Zn), bismuthinite (Bi), and alloys thereof, with an optional flux material. For example, the solder material can be eutectic Sn/Pb, high-lead, or lead-free.

Figure 2B:
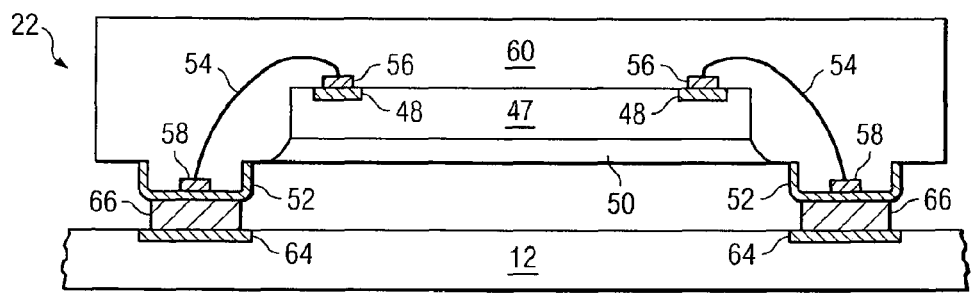

FIG. 2b illustrates further detail of BCC 22 mounted on PCB 12. Semiconductor die 47 is connected to a carrier by wire bond style first level packaging. BCC 22 is mounted to PCB 12 with a BCC style second level packaging. Semiconductor die 47 having contact pads 48 is mounted over a carrier using an underfill or epoxy-resin adhesive material 50. Semiconductor die 47 includes an active region containing analog or digital circuits implemented as active devices, passive devices, conductive layers, and dielectric layers formed within semiconductor die 47 and are electrically interconnected according to the electrical design of the die. For example, the circuit may include one or more transistors, diodes, inductors, capacitors, resistors, and other circuit elements formed within the active region of die 47. Contact pads 48 are made with a conductive material, such as Al, Cu, Sn, Ni, Au, or Ag, and are electrically connected to the circuit elements formed within die 47. Contact pads 48 are formed by PVD, CVD, electrolytic plating, or electroless plating process. Wire bonds 54 and bond pads 56 and 58 electrically connect contact pads 48 of semiconductor die 47 to contact pads 52 of BCC 22 forming the first level packaging. Molding compound or encapsulant 60 is deposited over semiconductor die 47, wire bonds 54, contact pads 48, and contact pads 52 to provide physical support and electrical isolation for the device. Contact pads 64 are formed on a surface of PCB 12 using evaporation, electrolytic plating, electroless plating, screen printing, PVD, or other suitable metal deposition process and are typically plated to prevent oxidation. Contact pads 64 electrically connect to one or more conductive signal traces 14. Solder material is deposited between contact pads 52 of BCC 22 and contact pads 64 of PCB 12. The solder material is reflowed to form bumps 66 which form a mechanical and electrical connection between BCC 22 and PCB 12.

Figure 2C:
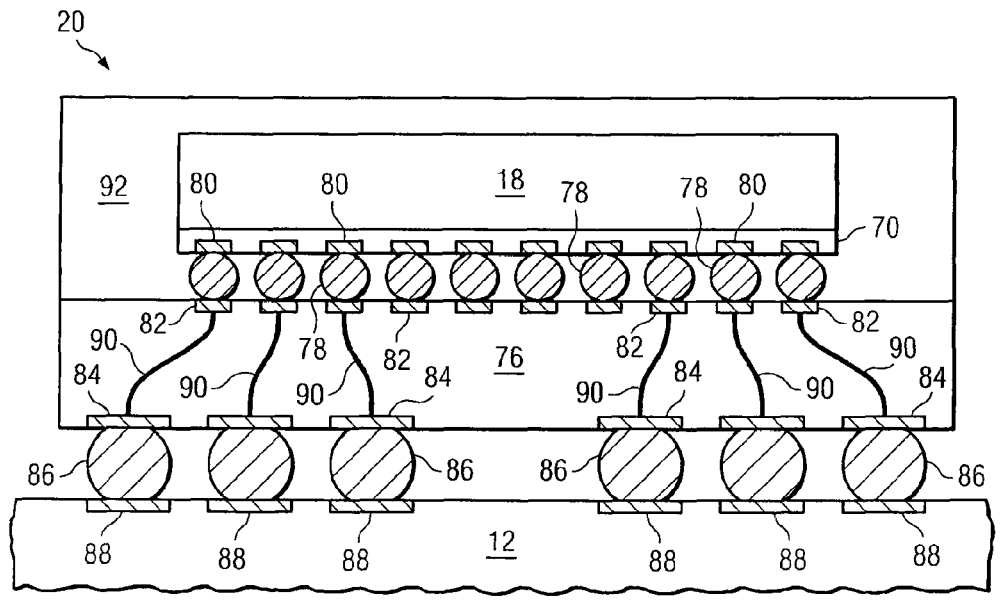

In FIG. 2c, semiconductor die 18 is mounted face down to carrier 76 with a flip chip style first level packaging. BGA 20 is attached to PCB 12 with a BGA style second level packaging. Active region 70 containing analog or digital circuits implemented as active devices, passive devices, conductive layers, and dielectric layers formed within semiconductor die 18 is electrically interconnected according to the electrical design of the die. For example, the circuit may include one or more transistors, diodes, inductors, capacitors, resistors, and other circuit elements formed within active region 70 of semiconductor die 18. Semiconductor die 18 is electrically and mechanically attached to carrier 76 through a large number of individual conductive solder bumps or balls 78. Solder bumps 78 are formed on bump pads or interconnect sites 80, which are disposed on active region 70. Bump pads 80 are made with a conductive material, such as Al, Cu, Sn, Ni, Au, or Ag, and are electrically connected to the circuit elements formed in active region 70. Bump pads 80 are formed by PVD, CVD, electrolytic plating, or electroless plating process. Solder bumps 78 are electrically and mechanically connected to contact pads or interconnect sites 82 on carrier 76 by a solder reflow process.

BGA 20 is electrically and mechanically attached to PCB 12 by a large number of individual conductive solder bumps or balls 86. The solder bumps are formed on bump pads or interconnect sites 84. The bump pads 84 are electrically connected to interconnect sites 82 through conductive lines 90 routed through carrier 76. Contact pads 88 are formed on a surface of PCB 12 using evaporation, electrolytic plating, electroless plating, screen printing, PVD, or other suitable metal deposition process and are typically plated to prevent oxidation. Contact pads 88 electrically connect to one or more conductive signal traces 14. The solder bumps 86 are electrically and mechanically connected to contact pads or bonding pads 88 on PCB 12 by a solder reflow process. Molding compound or encapsulant 92 is deposited over semiconductor die 18 and carrier 76 to provide physical support and electrical isolation for the device. The flip chip semiconductor device provides a short electrical conduction path from the active devices on semiconductor die 18 to conduction tracks on PCB 12 in order to reduce signal propagation distance, lower capacitance, and achieve overall better circuit performance. In another embodiment, the semiconductor die 18 can be mechanically and electrically attached directly to PCB 12 using flip chip style first level packaging without carrier 76.

Figure 3J:
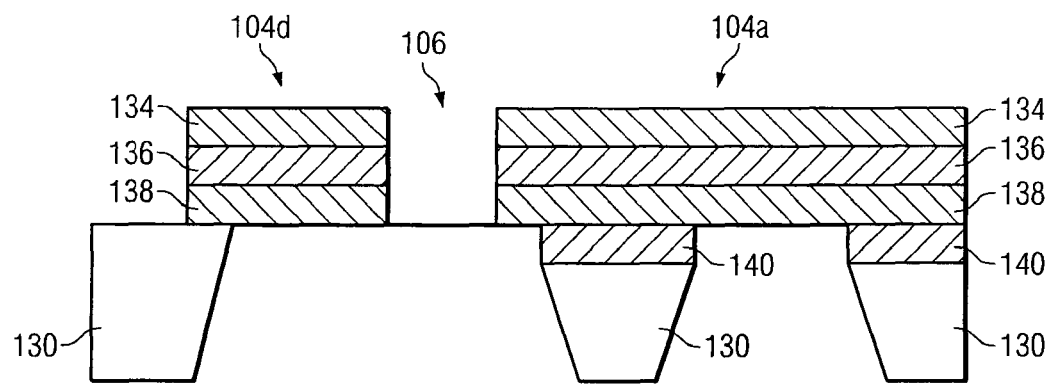

FIGS. 3a-3k illustrate a process of forming a vertical interconnect structure for three dimensional (3-D) fan-out wafer level chip scale package (FO-WLCSP). In FIG. 3a, a substrate or wafer 100 contains dummy or sacrificial base material such as silicon (Si), polymer, polymer composite, metal, ceramic, glass, glass epoxy, beryllium oxide, or other suitable low-cost, rigid material or bulk semiconductor material for structural support.

The interface layer 102 can be temporary bonding film or etch-stop layer. The temporary bonding film can be either heat or light releasable material. The etch-stop layer can be silicon dioxide (SiO2), silicon nitride (Si3N4), silicon oxynitride (SiON), organic film, or metal film with wet etching selectivity over layer 104. The interface layer 102 is deposited using lamination, PVD, CVD, printing, spin coating, spray coating, sintering, or thermal oxidation. The interface layer 102 is releasable in a later step by light or heat. Alternatively, 102 can be removed by etching process after removing carrier 100. In one embodiment, interface layer 102 is SiO2/Si3N4 thin film and acts as an etch-stop.

An electrically conductive layer 104 is formed over interface layer 102 using a deposition and patterning process to form individual portions or sections 104a-104d. FIG. 3b shows a top view of conductive layer 104a-104d, with conductive layer 104a being electrically isolated or partially isolated from conductive layer 104b-104d by gap 106 which exposes interface layer 102. Conductive layer 104 can be one or more layers of Al, Cu, Sn, Ni, Au, Ag, or other suitable electrically conductive material with typically top surface bondable materials to solder bumps 114. The deposition of conductive layer 104 uses PVD, CVD, sputtering, electrolytic plating, or electroless plating process. In one embodiment, conductive layer 104a is a solid film for conducting current for later-formed conductive pillars. Conductive layer 104b-104d includes a plated seed layer and under bump metallization (UBM) pads containing multiple layers of selectively plated Ni/Au, Ti/Cu, TiW/Cu, Ti/Cu/NiV/Cu, or their combination. UBM pads 104b-104d provide bondable pads for bonding with solder bumps 114, and may further provide a barrier to solder diffusion and seed layer for solder wettability.

In FIG. 3c, a photoresist layer 108 is deposited over interface layer 102 and conductive layer 104. A portion of photoresist layer 108 is exposed and removed by an etching development process. Conductive pillars or posts 110 are formed in the removed portion of photoresist 108 over conductive layer 104a using a selective plating process. Conductive pillars 110 can be Cu, Al, tungsten (W), Au, solder, or other suitable electrically conductive material. In one embodiment, conductive pillars 110 are formed by plating Cu in the patterned areas of photoresist 108. Conductive pillars 110 have a height ranging from 2-120 micrometers (μm). Photoresist 108 is stripped away leaving behind individual conductive pillars 110. In another embodiment, conductive pillars 110 can be replaced with solder balls or stud bumps.

In FIG. 3d, semiconductor die 112 are mounted to UBM pads 104b-104d with metal bumps, such as solder bumps 114 in a flipchip arrangement. Semiconductor die 112 include a substrate with an active region containing analog or digital circuits implemented as active devices, passive devices, conductive layers, and dielectric layers formed within the die and electrically interconnected according to the electrical design of the die. For example, the circuit may include one or more transistors, diodes, inductors, capacitors, resistors, and other circuit elements formed within the active region of die 112 to implement application specific integrated circuit (ASIC), memory devices, or other signal processing circuits. In another embodiment, passive components can be mounted to UBM pads 104b-104d.

FIG. 3e shows an encapsulant or molding compound 116 deposited over semiconductor die 112, conductive layer 104, interface layer 102, and around conductive pillars 110 using a paste printing, compressive molding, transfer molding, liquid encapsulant molding, vacuum lamination, or other suitable applicator. Encapsulant 116 can be polymer composite material, such as epoxy resin with filler, epoxy acrylate with filler, or polymer with proper filler. Encapsulant 116 is non-conductive and environmentally protects the semiconductor device from external elements and contaminants. The wafer topography is typically about 10-200 μm from the exposed die backside after encapsulation. Alternatively, additional backgrinding may be used to reduce the topography. Encapsulant 116 has a coefficient of thermal expansion (CTE) that is adjusted to match that of the base semiconductor material, e.g., Si, with a high glass transition temperature (Tg) in the range of 100° C. to 300° C. to reduce warpage. The CTE of encapsulant 116 can be adjusted using a filler such as a powder, fiber, or cloth additive. A suitable encapsulant material is generally characterized by good thermal conductivity similar to Si, low-shrinkage, high-resistivity of greater than 1.0 kohm-cm, low-dielectric constant of less than 3.5, and low-loss tangent of less than 0.02. Encapsulant 116 undergoes grinding or plasma etching to expose the top surface of conductive pillars 110 and semiconductor die 112. Conductive pillars 110 represent a through molding interconnect (TMI) structure.

In FIG. 3f, an insulating or passivation layer 118 is formed over conductive pillars 110, encapsulant 116, and semiconductor die 112 to planarize the wafer topography. The passivation layer 118 can be polyimide, benzocyclobutene (BCE), polybenzoxazoles (PBO), or other material having similar insulating and structural properties. The passivation layer 118 is deposited using printing, spin coating, spray coating, or lamination. In one embodiment, passivation layer 118 is a photo-sensitive, dielectric polymer low-cured at less than 200° C. The passivation layer 118 can be single or multiple layers. A portion of passivation layer 118 is removed by an etching process to expose the top surface of conductive pillars 110. The passivation layer 118 is optional.

An electrically conductive layer 120 is patterned and deposited over conductive pillars 110 and passivation layer 118. Conductive layer 120 can be Al, Cu, Sn, Ni, Au, Ag, or other suitable electrically conductive material. The deposition of conductive layer 120 uses PVD, CVD, electrolytic plating, or electroless plating process. Conductive layer 120 operates as a redistribution layer (RDL) to extend electrical connection for conductive pillar 110. In one embodiment, RDL 120 is a multi-layer structure containing Ti/Cu or Ti/Al alloy.

An insulating or passivation layer 122 is formed over passivation layer 118 and conductive layer 120 to planarize the wafer topography and protect the RDL layer. The passivation layer 122 can be polyimide, BCB, PBO, or other material having similar insulating and structural properties. The passivation layer 118 is deposited printing, spin coating, spray coating, or lamination. In one embodiment, passivation layer 122 is a photo-sensitive, dielectric polymer low-cured at less than 200° C. The passivation layer 122 can be single or multiple layers. A portion of passivation layer 122 is removed by an etching process to expose conductive layer 120 for package level interconnection. Additional passivation layers and RDLs can be added to the device structure as needed for interconnect functionality.

In FIG. 3g, carrier 100 and interface layer 102 are removed by chemical etching, mechanical peel-off, CMP, mechanical grinding, thermal bake, laser scanning, or wet stripping. A protective layer 124 is formed over conductive layer 120 and passivation layer 122 either before or after carrier and interface layer removal. Conductive layer 104a-104d remains as shown in FIG. 3b during carrier and interface layer removal. Conductive layer 104a is then selectively patterned and wet-etched to remove a portion of the conductive layer and form interconnect lines 126 and pads 128 in the design pattern shown in the cross-sectional view of FIG. 3h and top view of FIG. 3i. Conductive layer 104a can also be patterned to form additional circuit components, such as an inductor.

An insulating or passivation layer 130 is formed over conductive layer 104 and encapsulant 116. The passivation layer 130 can be polyimide, BCB, PBO, or other material having similar insulating and structural properties. The passivation layer 130 is deposited printing, spin coating, spray coating, or lamination. In one embodiment, passivation layer 130 is a photo-sensitive, dielectric polymer low-cured at less than 200° C. The passivation layer 130 can be single or multiple layers. A portion of passivation layer 130 is removed by an etching process to expose conductive layer 104.

FIG. 3j shows further detail of area 132 including conductive layer 104a and 104d and passivation layer 130. Conductive layer 104a-104d each include stacked top wetting layer 134, barrier layer 136, and bottom wetting layer 138, such as Cu/NiV/Cu, Cu/TiW/Cu, or Cu/Ti/Cu. Conductive layer 104a further includes titanium (Ti) film layer 140 as an adhesion layer. The adhesion layer can be TiW, Al, or Cr. The passivation layer 130 is formed over conductive layer 104a-104d. The exposed adhesion layer is etched after patterning of passivation layer 130.

Figure 3K:
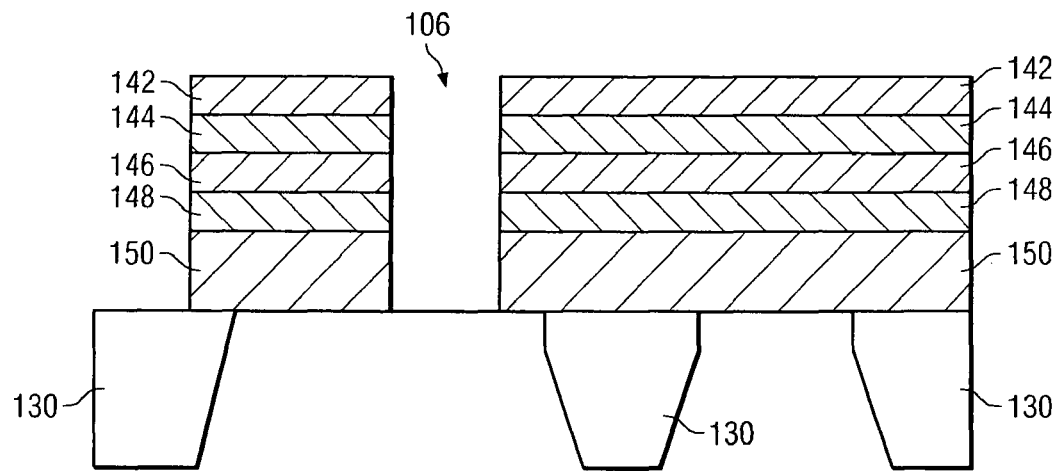

An alternate embodiment of conductive layer 104a-104d in area 132 is shown in FIG. 3k as stacked top wetting layer 142, barrier layer 144, optional bottom wetting layer 146, and adhesion layer, such as Ti or TiW film layer 148. Conductive layer 150 is a plated Cu layer on seed layer Cu as part of the conductive layer, and can be used to form inductor by using conductive layer 104a as seed layer for selective plating. The passivation layer 130 is formed over conductive layer 104a-104d.

FIG. 4a shows a 3-D FO-WLCSP from FIGS. 3a-3k with an electrically conductive solder material deposited over conductive layer 104a-104d using an evaporation, electrolytic plating, electroless plating, ball drop, or screen printing process. The solder material can be any metal or electrically conductive material, e.g., Sn, Ni, Au, Ag, Pb, Bi, and alloys thereof, with an optional flux material. For example, the solder material can be eutectic Sn/Pb, high-lead, or lead-free. The solder material is reflowed by heating the material above its melting point to form spherical balls or bumps 152 and 154. In some applications, solder bumps 152 and 154 are reflowed a second time to improve electrical contact to conductive layer 104a-104d. Solder bumps 152 act as a bridge between interconnect lines 126 and UBM pads 104b-104c, see FIGS. 3i and 4b. Solder bumps 154 are made higher than solder bumps 152 for next level interconnect without electrically shorting solder bumps 152. Solder bumps 152 and 154 represent one type of interconnect structure that can be formed over conductive layer 104a-104d. The interconnect structure can also use bond wires, 3-D interconnects, conductive paste, stud bump, micro bump, or other electrical interconnect. The 3-D FO-WLCSP provides electrical connection for semiconductor die 112 to external devices through a vertical interconnect structure including conductive layer 104, TMI conductive pillars 110, RDLs 120, and solder bumps 152 and 154.

Figure 5:
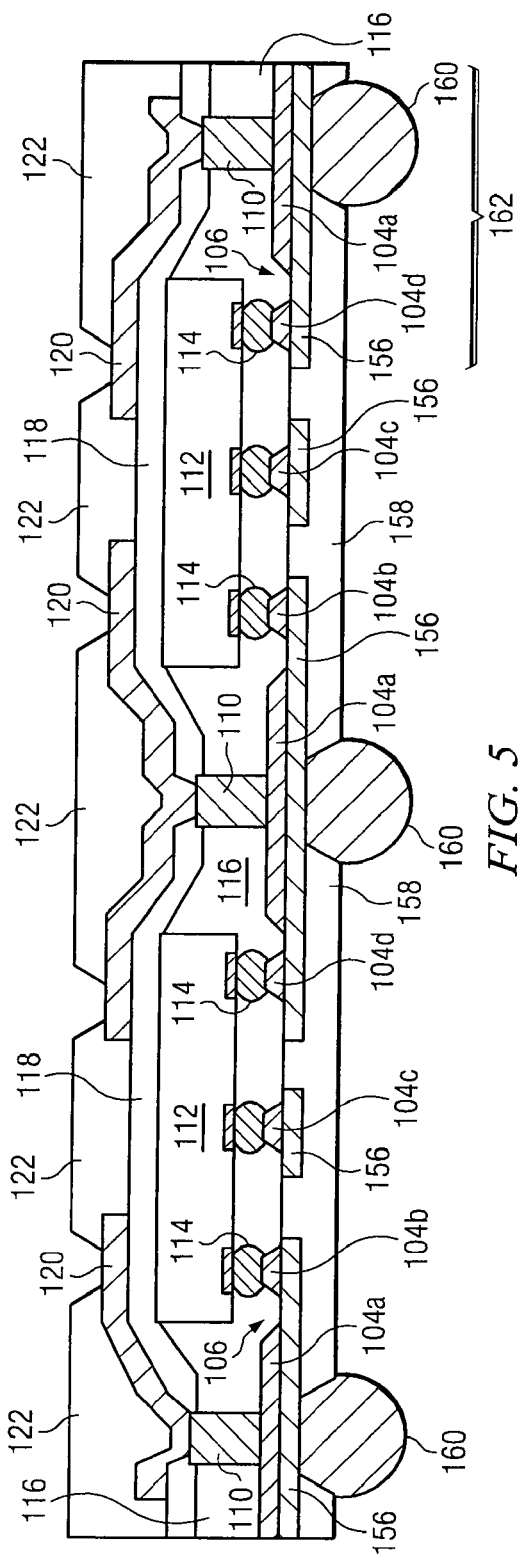
FIG. 5 illustrates an alternate embodiment of the FO-WLCSP with vertical interconnect structure.

An alternate embodiment of forming an interconnect structure for 3-D FO-WLCSP is shown in FIG. 5, using a process similar as FIGS. 3a-3k. Device elements in FIG. 5 having a similar function are assigned the same reference number as FIGS. 3a-3k.

A second electrically conductive layer 156 can be patterned and deposited over conductive layer 104 and encapsulant 116 after the carrier and interface layer are removed. Conductive layer 156 can be deposited together with conductive layer 104, but patterned at different process step. The deposition of conductive layer 156 uses PVD, CVD, electrolytic plating, or electroless plating process.

An insulating or passivation layer 158 is formed over conductive layer 156 and encapsulant 116. The passivation layer 158 can be polyimide, BCB, PBO, or other material having similar insulating and structural properties. The passivation layer 158 is deposited printing, spin coating, spray coating, or lamination. In one embodiment, passivation layer 158 is a photo-sensitive, dielectric polymer low-cured at less than 200° C. The passivation layer 158 can be single or multiple layers.

An electrically conductive solder material is deposited over conductive layer 156 using an evaporation, electrolytic plating, electroless plating, ball drop, or screen printing process. The solder material can be any metal or electrically conductive material, e.g., Sn, Ni, Au, Ag, Pb, Bi, and alloys thereof, with an optional flux material. For example, the solder material can be eutectic Sn/Pb, high-lead, or lead-free. The solder material is reflowed by heating the material above its melting point to form spherical balls or bumps 160. In some applications, solder bumps 160 are reflowed a second time to improve electrical contact to conductive layer 156.

Solder bumps 160 represent one type of interconnect structure that can be formed over conductive layer 156. The interconnect structure can also use bond wires, 3-D interconnects, conductive paste, stud bump, micro bump, or other electrical interconnect. The 3-D FO-WLCSP provides electrical connection for semiconductor die 112 to external devices through a vertical interconnect structure including conductive layers 104 and 156, TMI conductive pillars 110, RDLs 120, and solder bumps 160.

Figure 6:
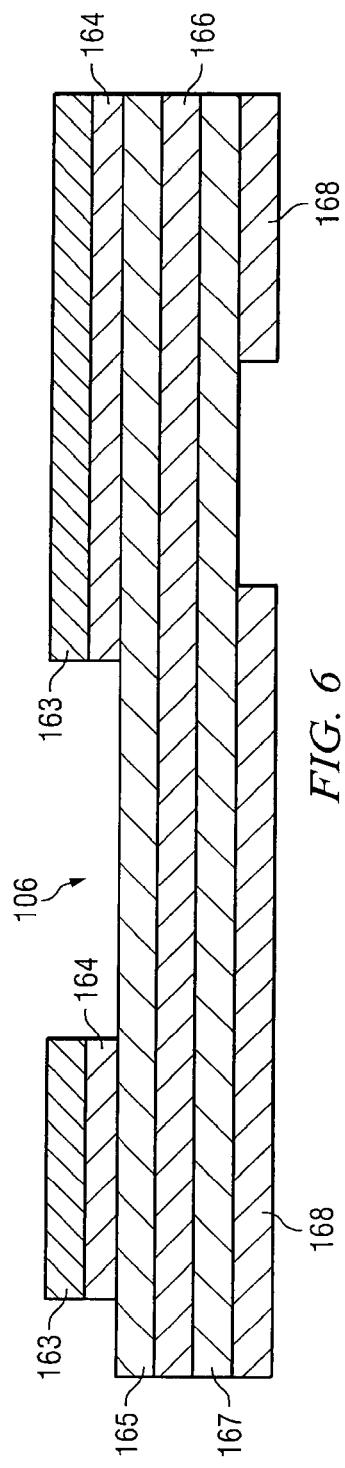
FIG. 6 illustrates the multi-layer UBM for the vertical interconnect structure of the FO-WLCSP.

FIG. 6 shows further detail of area 162 including conductive layers 104a and 104d and 156. Conductive layer 104a-104d each include stacked top wetting layer 163, e.g. Cu, and barrier layer 164, e.g. nickel vanadium (NiV) or Ni. Conductive layer 156 includes optional middle adhesion layer 165, e.g. Ti or TiW, optional barrier layer 166, e.g. NiV or Ni, bottom wetting layer 167, e.g. Cu, and bottom adhesive layer 168, e.g. Ti, which operates as RDL and UBM pad for solder interconnection after removing the process carrier. In one embodiment, stacked layers 163-168 are deposited in a single process step. Alternatively, stacked layers 163-168 are deposited in multiple patterned steps, e.g., layers 163-164 are patterned before plating and layers 165-168 are deposited as a blanket plated seed layer.

Another embodiment of forming an interconnect structure for 3-D FO-WLCSP is shown in FIG. 7, using a process similar to FIGS. 3a-3k. An electrically conductive layer 170 is formed over a temporary carrier and interface layer, similar to FIG. 3a, using a patterning and deposition process to form individual portions or sections 170a-170d. Conductive layer 170a is electrically isolated from conductive layer 170b-170d. Conductive layer 170b-170d includes a plated seed layer and UBM pads containing multiple layers of selectively plated Ni/Au, Ti/Cu, or Ti/Cu/NiV/Cu.

Semiconductor die 172 are mounted to UBM pads 170b-170d with solder bumps 174 in a flipchip arrangement. Semiconductor die 172 include a substrate with an active region containing analog or digital circuits implemented as active devices, passive devices, conductive layers, and dielectric layers formed within the die and electrically interconnected according to the electrical design of the die. For example, the circuit may include one or more transistors, diodes, inductors, capacitors, resistors, and other circuit elements formed within the active region of die 172 to implement ASIC, memory devices, or other signal processing circuits. In another embodiment, passive components can be mounted to UBM pads 170b-170d.

Conductive pillars or posts 176 are formed over conductive layer 170a using a photolithographic process. Conductive pillars 176 can be Cu, Al, W, Au, solder, or other suitable electrically conductive material. In one embodiment, conductive pillars 176 are formed by plating Cu in the patterned areas of photoresist. Conductive pillars 176 have a height ranging from 2-120 μm.

A first encapsulant or molding compound 178 is deposited over semiconductor die 172 and conductive layer 170 and around conductive pillars 176 using a paste printing, compressive molding, transfer molding, liquid encapsulant molding, vacuum lamination, or other suitable applicator. Encapsulant 178 can be polymer composite material, such as epoxy resin with filler, epoxy acrylate with filler, or polymer with proper filler. Encapsulant 178 is non-conductive and environmentally protects the semiconductor device from external elements and contaminants. The wafer topography is typically about 10-200 μm from the exposed die backside after encapsulation. Encapsulant 178 has a CTE that is adjusted to match that of the base semiconductor material, e.g., Si, with a high Tg in the range of 100° C. to 300° C. to reduce warpage.

The CTE of encapsulant 178 can be adjusted using a filler such as a powder, fiber, or cloth additive. A suitable encapsulant material is generally characterized by good thermal conductivity similar to Si, low-shrinkage, high-resistivity of greater than 1.0 kohm-cm, low-dielectric constant of less than 3.5, and low-loss tangent of less than 0.02. Encapsulant 178 undergoes grinding or plasma etching to expose the top surface of conductive pillars 176 and semiconductor die 172. Conductive pillars 176 represent a TMI structure.

An electrically conductive solder material is deposited over conductive pillars 176 using an evaporation, electrolytic plating, electroless plating, ball drop, or screen printing process. The solder material can be any metal or electrically conductive material, e.g., Sn, Ni, Au, Ag, Pb, Bi, and alloys thereof, with an optional flux material. For example, the solder material can be eutectic Sn/Pb, high-lead, or lead-free. The solder material is reflowed by heating the material above its melting point to form spherical balls or bumps 180. In some applications, solder bumps 180 are reflowed a second time to improve electrical contact to conductive pillars 176.

A second encapsulant or molding compound 182 is deposited over first encapsulant 178 and semiconductor die 172 and around solder bumps 180 using a paste printing, compressive molding, transfer molding, liquid encapsulant molding, vacuum lamination, or other suitable applicator. Encapsulant 182 can be polymer composite material, such as epoxy resin with filler, epoxy acrylate with filler, or polymer with proper filler. Encapsulant 182 is non-conductive and environmentally protects the semiconductor device from external elements and contaminants.

An electrically conductive layer 184 is patterned and deposited over solder bumps 180 and second encapsulant 182. Conductive layer 184 can be Al, Cu, Sn, Ni, Au, Ag, or other suitable electrically conductive material. The deposition of conductive layer 184 uses PVD, CVD, electrolytic plating, or electroless plating process. Conductive layer 184 operates as an RDL to extend electrical connection for conductive pillar 176 and solder bumps 180. In one embodiment, RDL 184 is a multi-layer structure containing Ti/Cu or Ti/Al alloy.

An insulating or passivation layer 186 is formed over second encapsulant 182 and conductive layer 184 to planarize the wafer topography and protect the RDL layer. The passivation layer 186 can be polyimide, BCB, PBO, or other material having similar insulating and structural properties. The passivation layer 186 is deposited printing, spin coating, spray coating, or lamination. In one embodiment, passivation layer 186 is a photo-sensitive, dielectric polymer low-cured at less than 200° C. The passivation layer 186 can be single or multiple layers. A portion of passivation layer 186 is removed by an etching process to expose conductive layer 184 for package level interconnection. Additional passivation layers and RDLs can be added to the device structure as needed for interconnect functionality.

The carrier and interface layer are removed by chemical etching, mechanical peel-off, CMP, mechanical grinding, thermal bake, laser scanning, or wet stripping. Conductive layer 170a is selectively patterned and wet etched to remove a portion of the conductive layer and form interconnect lines and pads, similar to FIGS. 3h and 3i.

An insulating or passivation layer 188 is formed over conductive layer 170 and encapsulant 178. The passivation layer 188 can be polyimide, BCB, PBO, or other material having similar insulating and structural properties. The passivation layer 188 is deposited printing, spin coating, spray coating, or lamination. In one embodiment, passivation layer 188 is a photo-sensitive, dielectric polymer low-cured at less than 200° C. The passivation layer 188 can be single or multiple layers. A portion of passivation layer 188 is removed by an etching process to expose conductive layer 170.

An electrically conductive solder material is deposited over conductive layer 170a-170d using an evaporation, electrolytic plating, electroless plating, ball drop, or screen printing process. The solder material can be any metal or electrically conductive material, e.g., Sn, Ni, Au, Ag, Pb, Bi, and alloys thereof, with an optional flux material. For example, the solder material can be eutectic Sn/Pb, high-lead, or lead-free. The solder material is reflowed by heating the material above its melting point to form spherical balls or bumps 190 and 192. In some applications, solder bumps 190 and 192 are reflowed a second time to improve electrical contact to conductive layer 170a-170d. Solder bumps 190 act as a bridge between interconnect lines 126 and UBM pads 128, similar to FIGS. 3i and 4b. Solder bumps 192 are made larger than solder bumps 190 for next level interconnect without electrically shorting solder bumps 190. Solder bumps 190 and 192 represent one type of interconnect structure that can be formed over conductive layer 170a-170d. The interconnect structure can also use bond wires, 3-D interconnects, conductive paste, stud bump, micro bump, or other electrical interconnect. The 3-D FO-WLCSP provides electrical connection for semiconductor die 172 to external devices through a vertical interconnect structure including conductive layer 170, TMI conductive pillars 176, RDLs 184, and solder bumps 180, 190, and 192.

Figure 8B:
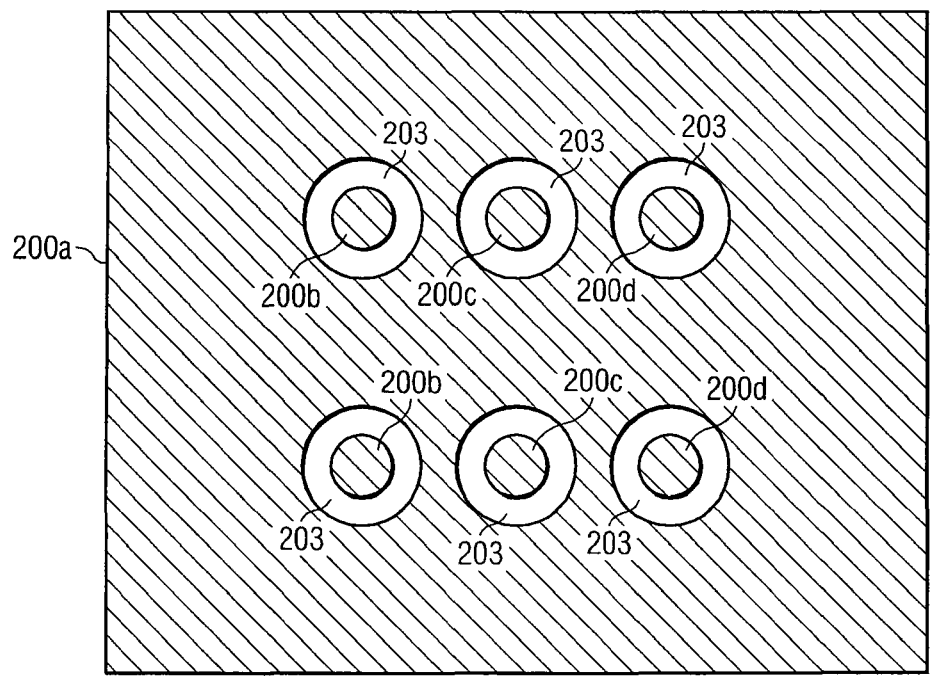

Another embodiment of forming an interconnect structure for 3-D FO-WLCSP is shown in FIG. 8a, using a process similar to FIGS. 3a-3k. An electrically conductive layer 200 is formed over a temporary carrier and interface layer, as shown in FIG. 8b, using a patterning and deposition process to form individual portions or sections 200a-200d. Conductive layer 200a is electrically isolated from conductive layer 200b-200d by gap 203. Conductive layer 200b-200d includes a plated seed layer and UBM pads containing multiple layers of selectively plated Ni/Au, Ti/Cu, or Ti/Cu/NiV/Cu.

Semiconductor die 202 are mounted to UBM pads 200b-200d with solder bumps 204 in a flipchip arrangement. Semiconductor die 202 include a substrate with an active region containing analog or digital circuits implemented as active devices, passive devices, conductive layers, and dielectric layers formed within the die and electrically interconnected according to the electrical design of the die. For example, the circuit may include one or more transistors, diodes, inductors, capacitors, resistors, and other circuit elements formed within the active region of die 202 to implement ASIC, memory devices, or other signal processing circuits. In another embodiment, passive components can be mounted to UBM pads 200b-200d.

Conductive pillars or posts 206 are formed over conductive layer 200a using a photolithographic process. Conductive pillars 206 can be Cu, Al, W, Au, solder, or other suitable electrically conductive material. In one embodiment, conductive pillars 206 are formed by plating Cu in the patterned areas of photoresist. Conductive pillars 206 have a height ranging from 2-120 μm.

An encapsulant or molding compound 208 is deposited over semiconductor die 202 and conductive layer 200 and around conductive pillars 206 using a paste printing, compressive molding, transfer molding, liquid encapsulant molding, vacuum lamination, or other suitable applicator. Encapsulant 208 can be polymer composite material, such as epoxy resin with filler, epoxy acrylate with filler, or polymer with proper filler. Encapsulant 208 is non-conductive and environmentally protects the semiconductor device from external elements and contaminants. The wafer topography is typically about 10-200 μm from the exposed die backside after encapsulation. Encapsulant 208 has a CTE that is adjusted to match that of the base semiconductor material, e.g., Si, with a high Tg in the range of 100° C. to 300° C. to reduce warpage. The CTE of encapsulant 208 can be adjusted using a filler such as a powder, fiber, or cloth additive. A suitable encapsulant material is generally characterized by good thermal conductivity similar to Si, low-shrinkage, high-resistivity of greater than 1.0 kohm-cm, low-dielectric constant of less than 3.5, and low-loss tangent of less than 0.02. Encapsulant 208 undergoes grinding or plasma etching to expose the top surface of conductive pillars 206 and semiconductor die 202. Conductive pillars 206 represent a TMI structure.

An insulating or passivation layer 210 is formed over encapsulant 208 and conductive pillars 206 to planarize the wafer topography. The passivation layer 210 can be polyimide, BCB, PBO, or other material having similar insulating and structural properties. The passivation layer 220 is deposited printing, spin coating, spray coating, or lamination. In one embodiment, passivation layer 210 is a photo-sensitive, dielectric polymer low-cured at less than 200° C. The passivation layer 210 can be single or multiple layers. A portion of passivation layer 210 is removed by an etching process to expose the top surface of conductive pillars 206.

An electrically conductive layer 212 is patterned and deposited over conductive pillars 206 and passivation layer 210. Conductive layer 212 can be Al, Cu, Sn, Ni, Au, Ag, or other suitable electrically conductive material. The deposition of conductive layer 212 uses PVD, CVD, electrolytic plating, or electroless plating process. Conductive layer 212 operates as an RDL to extend electrical connection for conductive pillar 206. In one embodiment, RDL 212 is a multilayer structure containing Ti/Cu or Ti/Al alloy.

An insulating or passivation layer 214 is formed over passivation layer 210 and conductive layer 212 to planarize the wafer topography and protect the RDL layer. The passivation layer 214 can be polyimide, BCB, PBO, or other material having similar insulating and structural properties. The passivation layer 214 is deposited printing, spin coating, spray coating, or lamination. In one embodiment, passivation layer 214 is a photo-sensitive, dielectric polymer low-cured at less than 200° C. The passivation layer 214 can be single or multiple layers. A portion of passivation layer 214 is removed by an etching process to expose conductive layer 212 for package level interconnection. Additional passivation layers and RDLs can be added to the device structure as needed for interconnect functionality.

Figure 8C:
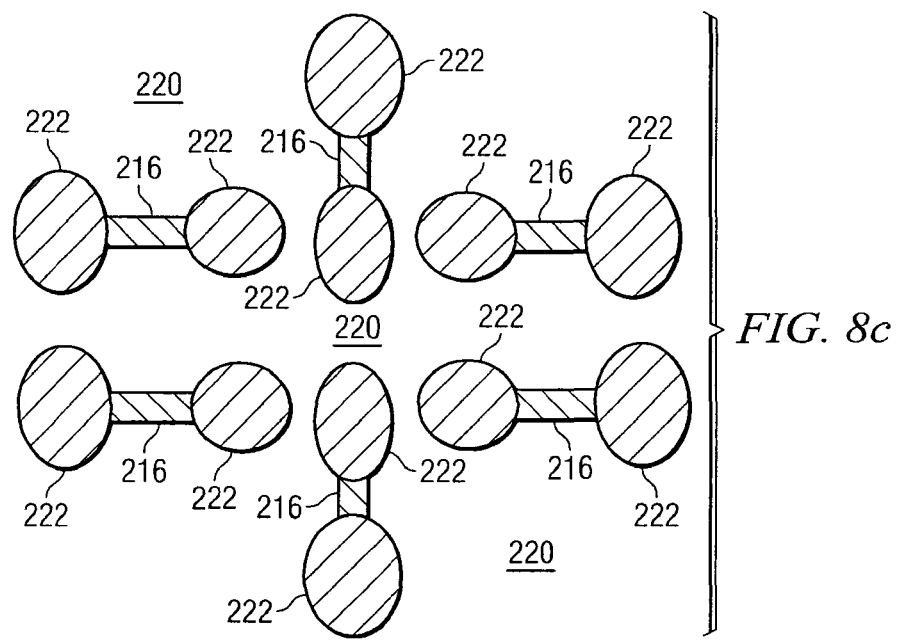

A protective layer can be formed over conductive layer 212 and passivation layer 214 either before or after carrier and interface layer removal. Conductive layer 200a-200d remains as shown in FIG. 8b during carrier and interface layer removal. The carrier and interface layer are removed by chemical etching, mechanical peel-off, CMP, mechanical grinding, thermal bake, laser scanning, or wet stripping. Conductive layer 200a is then selectively patterned and wet-etched to remove a portion of the conductive layer and form interconnect lines and pads 216 in the design pattern shown in the cross-sectional view of FIG. 8a and top view of FIG. 8c. Conductive layer 200a can also be patterned to form additional circuit components, such as an inductor.

An electrically conductive layer 218 is patterned and deposited over conductive layer 200. Conductive layer 218 can be Al, Cu, Sn, Ni, Au, Ag, or other suitable electrically conductive material. The deposition of conductive layer 218 uses PVD, CVD, electrolytic plating, or electroless plating process. Conductive layer 218 operates as an RDL to extend electrical connection for conductive layer 200. In one embodiment, RDL 218 is a multi-layer structure containing Ti/Cu or Ti/Al alloy.

An insulating or passivation layer 220 is formed over conductive layer 218 and encapsulant 206. The passivation layer 220 can be polyimide, BCB, PBO, or other material having similar insulating and structural properties. The passivation layer 220 is deposited printing, spin coating, spray coating, or lamination. In one embodiment, passivation layer 220 is a photo-sensitive, dielectric polymer low-cured at less than 200° C. The passivation layer 220 can be single or multiple layers. A portion of passivation layer 220 is removed by an etching process to expose conductive layer 218.

An electrically conductive solder material is deposited over conductive layer 218 using an evaporation, electrolytic plating, electroless plating, ball drop, or screen printing process. The solder material can be any metal or electrically conductive material, e.g., Sn, Ni, Au, Ag, Pb, Bi, and alloys thereof, with an optional flux material. For example, the solder material can be eutectic Sn/Pb, high-lead, or lead-free. The solder material is reflowed by heating the material above its melting point to form spherical balls or bumps 222. In some applications, solder bumps 222 are reflowed a second time to improve electrical contact to conductive layer 218. Solder bumps 222 represent one type of interconnect structure that can be formed over conductive layer 218. The interconnect structure can also use bond wires, 3-D interconnects, conductive paste, stud bump, micro bump, or other electrical interconnect. The 3-D FO-WLCSP provides electrical connection for semiconductor die 202 to external devices through a vertical interconnect structure including conductive layers 200 and 218, TMI conductive pillars 206, RDLs 212, and solder bumps 222.

FIGS. 9a-9b illustrate another process of forming an interconnect structure for 3-D FO-WLCSP. In FIG. 9a, a substrate or wafer 230 contains dummy or sacrificial base material such as Si, polymer, polymer composite, metal, ceramic, glass, glass epoxy, beryllium oxide, or other suitable low-cost, rigid material or bulk semiconductor material for structural support.

An interface layer 232 is deposited over carrier 230. The interface layer 232 can be temporary bonding film or etch-stop layer. The temporary bonding film can be either heat or light releasable material. The etch-stop layer can be SiO2, Si3N4, SiON, organic film, or metal film. The interface layer 232 is deposited using lamination, PVD, CVD, printing, spin coating, spray coating, sintering or thermal oxidation. In one embodiment, interface layer 102 is SiO2/Si3N4 thin film and acts as an etch-stop.

A photoresist layer is deposited over interface layer 232. A portion of the photoresist is exposed and removed by an etching process. Conductive pillars or posts 234 are formed in the removed portion of the photoresist using a photolithographic process. Conductive pillars 234 can be Cu, Al, W, Au, solder, or other suitable electrically conductive material. In one embodiment, conductive pillars 234 are formed by plating Cu in the patterned areas of the photoresist. Conductive pillars 234 have a height ranging from 2-120 μm. The photoresist is stripped away leaving behind individual conductive pillars 234. In another embodiment, TMI conductive pillars 234 can be replaced with solder balls or stud bumps.

A plurality of semiconductor die 236 with contact pads 237 are mounted to interface layer 232 with pre-applied and strippable adhesive 238. Semiconductor die 236 each include a substrate with an active region containing analog or digital circuits implemented as active devices, passive devices, conductive layers, and dielectric layers formed within the die and electrically interconnected according to the electrical design of the die. For example, the circuit may include one or more transistors, diodes, inductors, capacitors, resistors, and other circuit elements formed within the active region of die 236 to implement ASIC, memory devices, or other signal processing circuits.

An encapsulant or molding compound 240 is deposited over semiconductor die 236, interface layer 232, and around conductive pillars 234 using a paste printing, compressive molding, transfer molding, liquid encapsulant molding, vacuum lamination, or other suitable applicator. Encapsulant 240 can be polymer composite material, such as epoxy resin with filler, epoxy acrylate with filler, or polymer with proper filler. Encapsulant 240 is non-conductive and environmentally protects the semiconductor device from external elements and contaminants. The wafer topography is typically about 10-200 μm from the exposed die backside after encapsulation. Encapsulant 240 has a CTE that is adjusted to match that of the base semiconductor material, e.g., Si, with a high Tg in the range of 100° C. to 300° C. to reduce warpage. The CTE of encapsulant 240 can be adjusted using a filler such as a powder, fiber, or cloth additive. A suitable encapsulant material is generally characterized by good thermal conductivity similar to Si, low-shrinkage, high-resistivity of greater than 1.0 kohm-cm, low-dielectric constant of less than 3.5, and low-loss tangent of less than 0.02. Encapsulant 240 undergoes grinding or plasma etching to expose the top surface of conductive pillars 234 and semiconductor die 236. Conductive pillars 234 represent a TMI structure.

An insulating or passivation layer 242 is formed over encapsulant 240 and semiconductor die 236 to planarize the wafer topography. The passivation layer 242 can be polyimide, BCB, PBO, or other material having similar insulating and structural properties. The passivation layer 242 is deposited printing, spin coating, spray coating, or lamination. In one embodiment, passivation layer 242 is a photo-sensitive, dielectric polymer low-cured at less than 200° C. The passivation layer 242 can be single or multiple layers. A portion of passivation layer 242 is removed by an etching process to expose the top surface of conductive pillars 234.

An electrically conductive layer 244 is patterned and deposited over conductive pillars 234 and passivation layer 242. Conductive layer 244 can be Al, Cu, Sn, Ni, Au, Ag, or other suitable electrically conductive material. The deposition of conductive layer 244 uses PVD, CVD, electrolytic plating, or electroless plating process. Conductive layer 244 operates as an RDL to extend electrical connection for conductive pillar 234. In one embodiment, RDL 244 is a multi-layer structure containing Ti/Cu or Ti/Al alloy.

An insulating or passivation layer 246 is formed over passivation layer 242 and conductive layer 244 to planarize the wafer topography and protect the RDL layer. The passivation layer 246 can be polyimide, BCB, PBO, or other material having similar insulating and structural properties. The passivation layer 246 is deposited printing, spin coating, spray coating, or lamination. In one embodiment, passivation layer 246 is a photo-sensitive, dielectric polymer low-cured at less than 200° C. The passivation layer 246 can be single or multiple layers. A portion of passivation layer 246 is removed by an etching process to expose conductive layer 244 for package level interconnection. Additional passivation layers and RDLs can be added to the device structure as needed for interconnect functionality.

In FIG. 9b, carrier 230, interface layer 232, and adhesive 238 are removed by chemical etching, mechanical peel-off, CMP, mechanical grinding, thermal bake, laser scanning, or wet stripping. A protective layer can be formed over conductive layer 244 and passivation layer 246 either before or after carrier and interface layer removal.

An insulating or passivation layer 248 is formed over conductive pillars 234, semiconductor die 236, and encapsulant 240. The passivation layer 248 can be polyimide, BCB, PBO, or other material having similar insulating and structural properties. The passivation layer 248 is deposited printing, spin coating, spray coating, or lamination. In one embodiment, passivation layer 248 is a photo-sensitive, dielectric polymer low-cured at less than 200° C. The passivation layer 248 can be single or multiple layers. A portion of passivation layer 248 is removed by an etching process to expose conductive pillars 234.

An electrically conductive layer 250 is patterned and deposited over conductive pillars 234 and passivation layer 248. Conductive layer 250 can be Al, Cu, Sn, Ni, Au, Ag, or other suitable electrically conductive material. The deposition of conductive layer 250 uses PVD, CVD, electrolytic plating, or electroless plating process. Conductive layer 250 operates as an RDL to extend electrical connection for conductive pillar 234.

An insulating or passivation layer 252 is formed over conductive layer 250 and passivation layer 248. The passivation layer 252 can be polyimide, BCB, PBO, or other material having similar insulating and structural properties. The passivation layer 252 is deposited printing, spin coating, spray coating, or lamination. A portion of passivation layer 252 is removed by an etching process to expose conductive layer 250.

An electrically conductive solder material deposited over conductive layer 250 using an evaporation, electrolytic plating, electroless plating, ball drop, or screen printing process. The solder material can be any metal or electrically conductive material, e.g., Sn, Ni, Au, Ag, Pb, Bi, and alloys thereof, with an optional flux material. For example, the solder material can be eutectic Sn/Pb, high-lead, or lead-free. The solder material is reflowed by heating the material above its melting point to form spherical balls or bumps 254. In some applications, solder bumps 254 are reflowed a second time to improve electrical contact to conductive layer 250. Solder bumps 254 represent one type of interconnect structure that can be formed over conductive layer 250. The interconnect structure can also use bond wires, 3-D interconnects, conductive paste, stud bump, micro bump, or other electrical interconnect. The 3-D FO-WLCSP provides electrical connection for semiconductor die 236 to external devices through a vertical interconnect structure including conductive layer 250, TMI conductive pillars 234, RDLs 244, and solder bumps 254.

Figure 10:
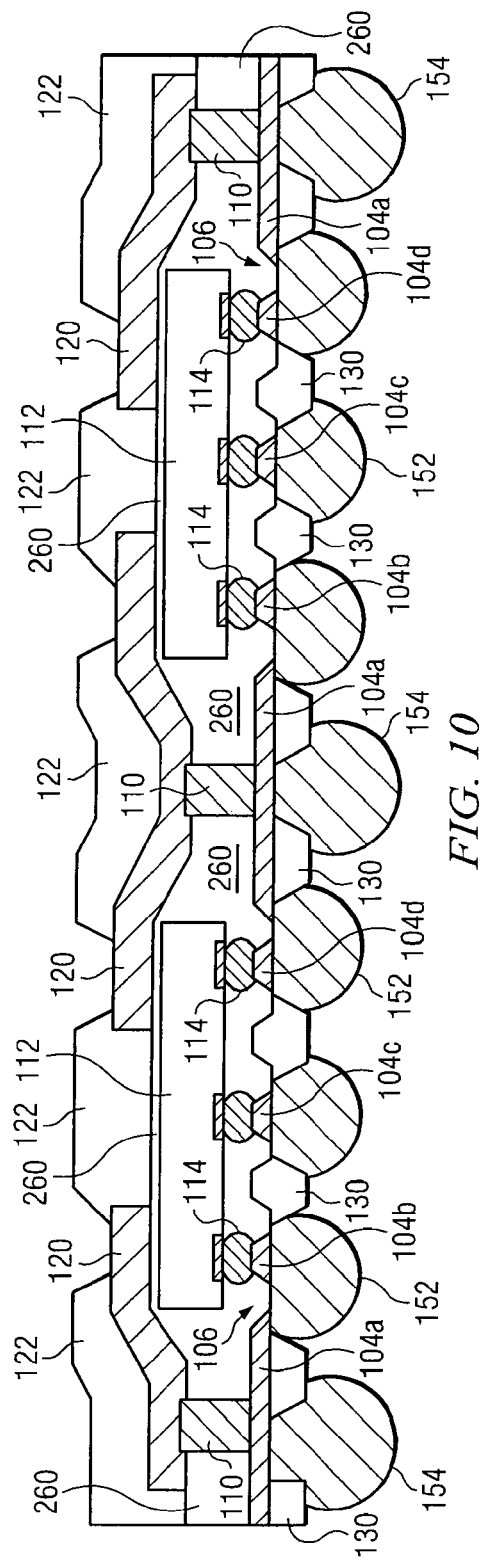
FIG. 10 illustrates the FO-WLCSP with vertical interconnect structure having encapsulant over the semiconductor die.

Another embodiment is shown in FIG. 10, using a process similar as FIGS. 3a-3k. Device elements in FIG. 10 having a similar function are assigned the same reference number as FIGS. 3a-3k.

An encapsulant or molding compound 260 is deposited over semiconductor die 112 and around conductive pillars 110 using a paste printing, compressive molding, transfer molding, liquid encapsulant molding, vacuum lamination, or other suitable applicator. Encapsulant 260 can be polymer composite material, such as epoxy resin with filler, epoxy acrylate with filler, or polymer with proper filler. Encapsulant 260 is non-conductive and environmentally protects the semiconductor device from external elements and contaminants. Encapsulant 260 has a CTE that is adjusted to match that of the base semiconductor material, e.g., Si, with a high Tg in the range of 100° C. to 300° C. to reduce warpage. The CTE of encapsulant 260 can be adjusted using a filler such as a powder, fiber, or cloth additive. A suitable encapsulant material is generally characterized by good thermal conductivity similar to Si, low-shrinkage, high-resistivity of greater than 1.0 kohm-cm, low-dielectric constant of less than 3.5, and low-loss tangent of less than 0.02. Encapsulant 260 undergoes grinding or plasma etching to expose the top surface of conductive pillars 110. Encapsulant 260 remains disposed over semiconductor die 112.

Figure 11:
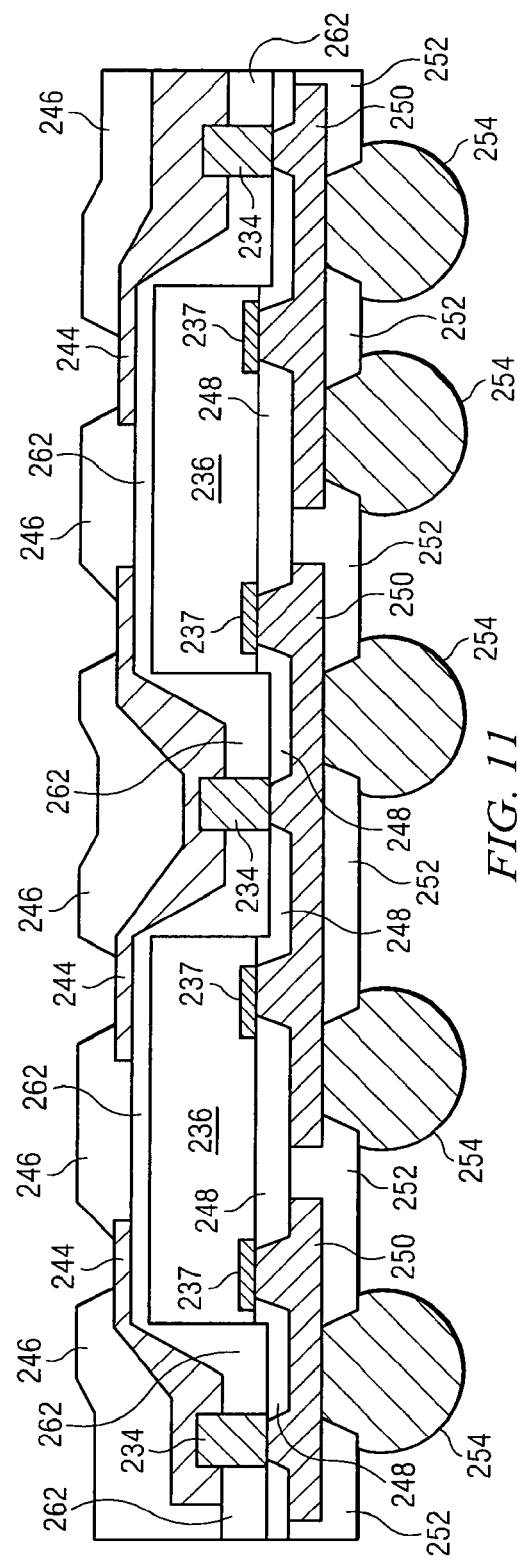
FIG. 11 illustrates the FO-WLCSP with another vertical interconnect structure having encapsulant over the semiconductor die.

Another embodiment is shown in FIG. 11, using a process similar as FIGS. 9a-9b. Device elements in FIG. 11 having a similar function are assigned the same reference number as FIGS. 9a-9b.

An encapsulant or molding compound 262 is deposited over semiconductor die 236 and around conductive pillars 234 using a paste printing, compressive molding, transfer molding, liquid encapsulant molding, vacuum lamination, or other suitable applicator. Encapsulant 262 can be polymer composite material, such as epoxy resin with filler, epoxy acrylate with filler, or polymer with proper filler. Encapsulant 262 is non-conductive and environmentally protects the semiconductor device from external elements and contaminants. Encapsulant 262 has a CTE that is adjusted to match that of the base semiconductor material, e.g., Si, with a high Tg in the range of 100° C. to 300° C. to reduce warpage. The CTE of encapsulant 262 can be adjusted using a filler such as a powder, fiber, or cloth additive. A suitable encapsulant material is generally characterized by good thermal conductivity similar to Si, low-shrinkage, high-resistivity of greater than 1.0 kohm-cm, low-dielectric constant of less than 3.5, and low-loss tangent of less than 0.02. Encapsulant 262 undergoes grinding or plasma etching to expose the top surface of conductive pillars 234. Encapsulant 262 remains disposed over semiconductor die 236.

In summary, a TMI structure in a FO-WLCSP uses plated conductive pillars on the carrier and partially exposed molding technology for better cost control and process integration. The interconnect uses the same metal layer for both flipchip bonding placement and conductive pillar plating. The same solder bump is used for both interconnection between different traces and the pad within module provides additional cost reduction.

While one or more embodiments of the present invention have been illustrated in detail, the skilled artisan will appreciate that modifications and adaptations to those embodiments may be made without departing from the scope of the present invention as set forth in the following claims.

What is claimed:

1. A semiconductor device, comprising:
    a first conductive layer including a first area isolated from a second area of the first conductive layer;
    a conductive pillar formed over a first surface of the first area of the first conductive layer;
    a semiconductor die or component disposed over a first surface of the second area of the first conductive layer; and
    a conductive bridge formed contacting a second surface of the second area of the first conductive layer opposite the first surface of the second area and a second surface of the first area of the first conductive layer opposite the first surface of the first area.

2. The semiconductor device of claim 1, wherein the first conductive layer includes a plurality of conductive layers.

3. The semiconductor device of claim 1, further including a second conductive layer formed over the first conductive layer.

4. The semiconductor device of claim 1, wherein the conductive bridge includes a second conductive layer including a plurality of conductive layers.

5. The semiconductor device of claim 1, further including:
an encapsulant deposited over the semiconductor die and around the conductive pillar;
a first insulating layer formed over the encapsulant;
a second conductive layer formed over the first insulating layer, the second conductive layer being electrically connected to the conductive pillar; and
a second insulating layer formed over the second conductive layer.

6. The semiconductor device of claim 1, wherein the first conductive layer includes an interconnect line and under bump metallization pad.

7. The semiconductor device of claim 1, further including a bump formed over the conductive pillar.

8. The semiconductor device of claim 1, wherein the conductive bridge includes a bump.

9. A semiconductor device, comprising:
a first conductive layer including a gap between a first area of the first conductive layer and a second area of the first conductive layer;
a conductive pillar formed over the first area of the first conductive layer;
a semiconductor die disposed over a first surface of the second area of the first conductive layer; and
a second conductive layer formed over the first area of the first conductive layer and a second surface of the second area of the first conductive layer opposite the first surface of the second area.

10. The semiconductor device of claim 9, further including a first encapsulant deposited over the semiconductor die and around the conductive pillar.

11. The semiconductor device of claim 9, wherein the first conductive layer includes an interconnect line and under bump metallization pad.

12. The semiconductor device of claim 9, wherein the first conductive layer includes a plurality of conductive layers.

13. The semiconductor device of claim 9, further including a third conductive layer formed over the first conductive layer.

14. The semiconductor device of claim 13, wherein the third conductive layer includes a plurality of conductive layers.

15. The semiconductor device of claim 9, further including an interconnect structure formed over the conductive pillar.

16. The semiconductor device of claim 10, further including a second encapsulant deposited over the first encapsulant.

17. The semiconductor device of claim 9, wherein the second conductive layer includes a bump.

18. A semiconductor device, comprising:
a conductive layer including a first area isolated from a second area of the conductive layer;
a conductive pillar disposed over the first area of the conductive layer;
a semiconductor die or component disposed over the second area of the conductive layer; and
a first bump formed over the first area of the conductive layer and the second area of the conductive layer.

19. The semiconductor device of claim 18, further including a first encapsulant deposited over the semiconductor die and around the conductive pillar.

20. The semiconductor device of claim 18, further including a second bump formed over the conductive pillar.

21. The semiconductor device of claim 19, further including a second encapsulant deposited over the first encapsulant.

22. A semiconductor device, comprising:
a first conductive layer including an interconnect line and under bump metallization pad;
a conductive pillar formed over the first conductive layer;
a semiconductor die disposed over the first conductive layer; and
a bump formed over the first conductive layer electrically connecting the interconnect line and under bump metallization pad.

23. The semiconductor device of claim 22, further including a solder bump formed over the conductive pillar.

24. The semiconductor device of claim 22, further including:
a first encapsulant deposited over the semiconductor die and around the conductive pillar; and
a second encapsulant deposited over the first encapsulant.

25. The semiconductor device of claim 22, wherein the first conductive layer includes a plurality of conductive layers.

26. The semiconductor device of claim 22, further including forming a second conductive layer over the first conductive layer, the second conductive layer including a plurality of conductive layers.

27. The semiconductor device of claim 5, further including an interconnect structure formed over the encapsulant, the interconnect structure being electrically connected to the conductive pillar.

28. The semiconductor device of claim 6, wherein the interconnect line includes a solder bridge.

29. The semiconductor device of claim 10, further including an interconnect structure formed over the first encapsulant, the interconnect structure being electrically connected to the conductive pillar.

30. The semiconductor device of claim 11, wherein the interconnect line includes a solder bridge.

31. The semiconductor device of claim 19, further including an interconnect structure formed over the first encapsulant, the interconnect structure being electrically connected to the conductive pillar.

32. The semiconductor device of claim 24, further including an interconnect structure formed over the first encapsulant, the interconnect structure being electrically connected to the conductive pillar.

* * * * *